(12) United States Patent
Kondo et al.

(10) Patent No.: US 9,363,928 B2
(45) Date of Patent: Jun. 7, 2016

(54) MODULE-TYPE DATA CENTER AND METHOD OF CONTROLLING THE SAME

(71) Applicant: FUJITSU LIMITED, Kawasaki-shi, Kanagawa (JP)

(72) Inventors: Masao Kondo, Sagamihara (JP); Hiroshi Endo, Isehara (JP); Shigeyoshi Umemiya, Fujisawa (JP); Takahiro Arioka, Isehara (JP); Hiroyuki Fukuda, Ebina (JP)

(73) Assignee: FUJITSU LIMITED, Kawasaki (JP)

( * ) Notice: Subject to any disclaimer, the term of this patent is extended or adjusted under 35 U.S.C. 154(b) by 15 days.

(21) Appl. No.: 14/495,875

(22) Filed: Sep. 24, 2014

(65) Prior Publication Data

US 2015/0049431 A1    Feb. 19, 2015

Related U.S. Application Data

(63) Continuation of application No. PCT/JP2012/058472, filed on Mar. 29, 2012.

(51) Int. Cl.
*H05K 7/20* (2006.01)
*C09K 5/04* (2006.01)
(Continued)

(52) U.S. Cl.
CPC ............ *H05K 7/20736* (2013.01); *C09K 5/041* (2013.01); *G06F 1/20* (2013.01); *H05K 7/1497* (2013.01); *H05K 7/20745* (2013.01); *H05K 7/20836* (2013.01)

(58) Field of Classification Search
CPC . H05K 7/20; H05K 7/20736; H05K 7/20745; H05K 7/20836; H05K 5/00; G06F 1/20; F28F 13/00; H01L 23/40

USPC .......... 361/679.46, 679.47–679.53, 688–697, 361/700–712, 715–727; 165/80.4, 80.5, 165/104.33, 104.34, 185, 121–126, 104.14; 62/259.2, 3.3, 135, 137, 440, 441, 267; 312/223.2, 223.3, 236, 265; 700/225, 700/278, 282, 299, 300; 454/184

See application file for complete search history.

(56) References Cited

U.S. PATENT DOCUMENTS 5,664,433 A * 9/1997 Bourne ................. F24F 5/0035
                                                       261/DIG. 3
7,826,216 B2 * 11/2010 Moss ................. H05K 7/20736
                                                       361/679.48

(Continued)

FOREIGN PATENT DOCUMENTS

GB         2478902       9/2011
JP         2000-320878   11/2000

(Continued)

OTHER PUBLICATIONS

International Search Report, mailed in connection with PCT/JP2012/058472 and mailed May 1, 2012.

(Continued)

*Primary Examiner* — Michail V Datskovskiy
(74) *Attorney, Agent, or Firm* — Fujitsu Patent Center

(57) ABSTRACT

A module-type data center includes: a casing including a first intake opening, a second intake opening, and an exhaust opening; an air conditioner provided in the casing and configured to generate a first airflow by taking in outside air through the first intake opening and bringing the outside air into direct contact with a refrigerant; a fan unit provided in the casing and configured to generate a second airflow by taking in the outside air through the second intake opening; and an electronic device provided in the casing and configured to be air-cooled by a mixed airflow of the first airflow and the second airflow and release an exhaust airflow after the air-cooling to the exhaust opening. The first intake opening and the second intake opening are provided on different surfaces of the casing.

20 Claims, 21 Drawing Sheets

(51) Int. Cl.
  *G06F 1/20* (2006.01)
  *H05K 7/14* (2006.01)

(56) References Cited

U.S. PATENT DOCUMENTS

| | | | | |
|---|---|---|---|---|
| 7,869,210 B2* | 1/2011 | Moss | ............... | H05K 7/20836 361/694 |
| 7,944,692 B2* | 5/2011 | Grantham | ............... | H05K 7/20745 361/688 |
| 8,031,468 B2* | 10/2011 | Bean, Jr. | ............... | H05K 7/20745 165/104.33 |
| 8,320,124 B2* | 11/2012 | Moss | ............... | H05K 7/20836 361/694 |
| 8,331,086 B1* | 12/2012 | Meissner | ............... | H05K 7/20736 312/223.2 |
| 8,462,496 B2* | 6/2013 | Schmitt | ............... | G06F 1/20 165/104.33 |
| 8,842,433 B2* | 9/2014 | Koblenz | ............... | G05D 23/1917 361/679.47 |
| 9,055,696 B2* | 6/2015 | Dunnavant | ............... | H05K 7/20745 |
| 2010/0051563 A1 | 3/2010 | Schreiber | | |
| 2010/0085707 A1* | 4/2010 | Moss | ............... | H05K 7/20836 361/695 |
| 2010/0134972 A1* | 6/2010 | Moss | ............... | H05K 7/20736 361/679.49 |
| 2010/0154448 A1* | 6/2010 | Hay | ............... | G06F 1/20 62/175 |
| 2010/0188810 A1* | 7/2010 | Andersen | ............... | H05K 7/20745 361/679.49 |
| 2011/0132581 A1* | 6/2011 | Moss | ............... | F24F 11/0001 165/104.33 |
| 2011/0256822 A1* | 10/2011 | Carlson | ............... | H05K 7/20827 454/184 |
| 2012/0168119 A1* | 7/2012 | Dunnavant | ............... | F24F 3/14 165/59 |
| 2012/0212901 A1* | 8/2012 | Schmitt | ............... | G06F 1/20 361/679.47 |

FOREIGN PATENT DOCUMENTS

| | | |
|---|---|---|
| JP | 2001-094284 | 4/2001 |
| JP | 2007-234941 | 9/2007 |
| JP | 2010-027700 | 2/2010 |
| JP | 2011-159144 | 8/2011 |
| JP | 2012-018584 | 1/2012 |
| WO | 2010039120 A1 | 4/2010 |

OTHER PUBLICATIONS

EESR—The Extended European Search Report of European Patent Application No. 12873472.0 dated Nov. 27, 2015.

* cited by examiner

US 9,363,928 B2

MODULE-TYPE DATA CENTER AND METHOD OF CONTROLLING THE SAME

CROSS-REFERENCE TO RELATED APPLICATION

This application is a continuation of International Patent Application No. PCT/JP2012/058472 filed Mar. 29, 2012 and designated the U.S., the entire contents of which are incorporated herein by reference.

FIELD

The embodiments discussed herein are related to a module-type data center and a method of controlling the same.

BACKGROUND

The development of network technology has brought a growing attention to a network service which provides users with various services via a network. For example, a service provider of such services provides, via a network, a user with a platform for executing a software package or application software.

An information processing system for providing such services is formed by racks each containing a plurality of electronic devices such as a server, and is installed in a data center, such as a server room, owned by the service provider.

The data center is provided with an air conditioning apparatus, such as an all-in-one air conditioning system, in order for the information processing system to operate under a temperature range at which operation thereof is guaranteed. However, it is inefficient to cool a large data center with an all-in-one air conditioning system.

SUMMARY

One aspect of the following disclosure provides a module-type data center including: a casing including a first intake opening, a second intake opening, and an exhaust opening; an air conditioner provided in the casing and configured to generate a first airflow by taking in outside air through the first intake opening and bringing the outside air into direct contact with a refrigerant; a fan unit provided in the casing and configured to generate a second airflow by taking in outside air through the second intake opening; and an electronic device provided in the casing, and configured to be exposed to a mixed airflow of the first airflow and the second airflow and release an exhaust airflow containing the mixed airflow to the exhaust opening. The first intake opening and the second intake opening are provided on different surfaces of the casing.

Moreover, another aspect of the disclosure provides a method of controlling a module-type data center, which method includes: generating a first airflow by taking in outside air through a first intake opening provided on a casing and bringing the outside air into direct contact with a refrigerant; generating a second airflow by taking in outside air through a second intake opening provided on a surface of the casing different from a surface having the first intake opening; and exposing an electronic device provided in the casing to a mixed airflow of the first airflow and the second airflow.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Before describing embodiments, a description is given of results of examination conducted by the inventors of the present application.

A conceivable way to increase the air conditioning efficiency of a data center is to use as compact space as possible as the data center so that heat produced by electronic devices in the data center does not spread peripherally.

Figure 1:
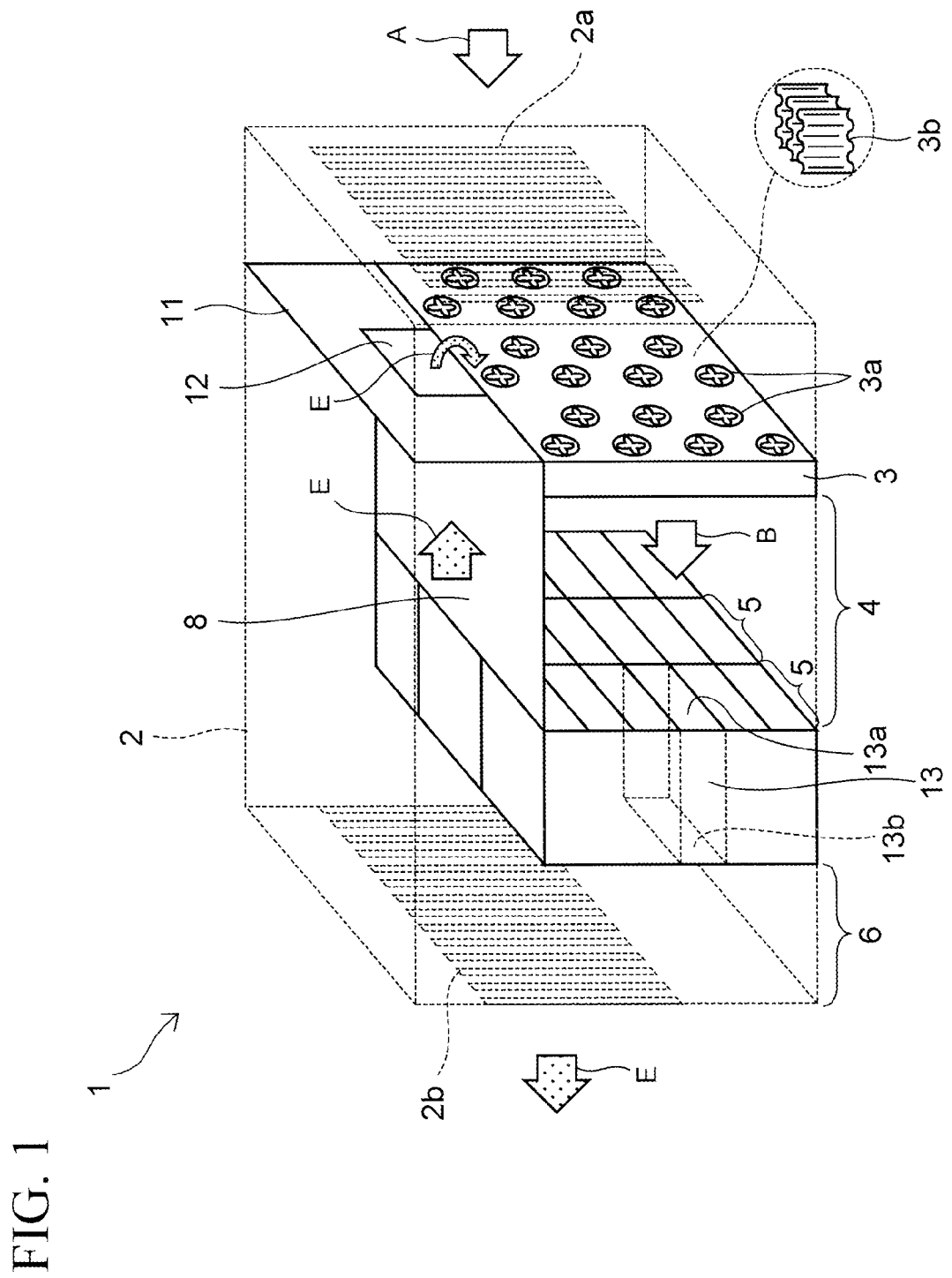
FIG. 1 is a perspective view illustrating the internal configuration of a data center examined.

FIG. 1 is a perspective view illustrating the internal configuration of a data center conceived of from such a viewpoint.

This data center 1 includes a compact container 2 inside which an air conditioner 3 and racks 5 are provided. The data center 1 having the modules, such as the racks 5 and the air conditioner 3 playing the functions of the data center, inside a single container 2 is called a module-type data center hereinbelow.

The air conditioner 3 has fans 3a for taking in outside air A through an intake opening 2a of the container 2 and elements 3b impregnated with water, and generates an airflow B by cooling the outside air A with the evaporative latent heat of the water. Such an air conditioner configured to cool outside air with evaporative latent heat of a refrigerant such as water is also called a vaporization cooling apparatus.

Each rack 5 includes a plurality of electronic devices 13 such as servers which are air-cooled by the airflow B mentioned above. Each electronic device 13 has an intake surface 13a for taking the airflow B into itself, and is cooled by the airflow B taken in through the intake surface 13a. Then, an exhaust airflow E warmed up by cooling the electronic device 13 is exhausted from an exhaust surface 13b of the electronic device 13 and is thereafter released to the outside through an exhaust opening 2b of the container 2.

Space between each intake surface 13a and the opposite air conditioner 3 serves as a cold aisle 4 through which the cold airflow B for cooling the electronic devices 13 passes. In addition, space between each exhaust surface 13b and the opposite exhaust opening 2b serves as a hot aisle 6 through which the exhaust airflow E warmed up by the electronic devices 13 passes.

Part of the exhaust airflow E in the hot aisle 6 flows toward the air conditioner 3 along the ceiling of the container 2. Since a top panel 8 is provided on top of the cold aisle 4, no exhaust airflow E directly flows into the cold aisle 4.

A partitioning plate 11 and a damper 12 are provided on the air conditioner 3. When the damper 12 opens, the exhaust airflow E flows into the air conditioner 3.

According to this data center 1, since the racks 5 are accommodated in the compact container 2, heat produced by each electronic device 13 of the racks 5 is encapsulated in the container 2. This allows the air conditioner 3 to efficiently cool the electronic devices 13.

The damper 12 is opened when the temperature of the outside air A is low, so as to bring the warm exhaust airflow E back to the air conditioner 3 and then back to the racks 5. This may prevent the airflow B from having a temperature below a temperature at which operation of the electronic devices 13 is guaranteed.

Since the air conditioner 3 cools the outside air A with the evaporative latent heat of water, an elaborate component, such as a compressor, of an all-in-one air conditioning system is not used, which helps achieve reduction in costs and energy consumption of the data center 1.

Moreover, without the air conditioner 3, the installation location of the data center 1 would be limited to a cold weather region or a high-altitude region so that the electronic devices 13 may be sufficiently cooled by the outside air A. However, with the air conditioner 3 for cooling the outside air A, geographical limitations for installing the data center 1 may be mitigated.

This configuration, however, has the following drawback. Specifically, even when the air conditioner 3 does not have to be driven because the temperature of the outside air A is low enough to cool the electronic devices 13, the fans 3a of the air conditioner 3 are preferably constantly rotated to generate the airflow B and therefore consume power wastefully.

In addition, since the elements 3b of the air conditioner 3 act to hinder the flow of the outside air A, a large pressure difference occurs between the upstream side and the downstream side of the air conditioner 3. Due to this pressure difference, the fans 3a rotate at a higher speed to generate the airflow B, and consequently, consume even more power.

Moreover, the constant rotation of the fans 3a causes the intake opening 2a to suck in the outside air A continuously. Hence, in a case such as where the intake opening 2a is provided with a filter, the filter is clogged up.

Furthermore, the intake opening 2a is provided on one surface of the container 2; therefore, if a strong wind strikes that surface, outside air is disturbed near the intake opening 2a, which makes it hard to take the outside air A into the container 2 through the intake opening 2a.

Hereinbelow, embodiments are discussed.

First Embodiment

Figure 2:
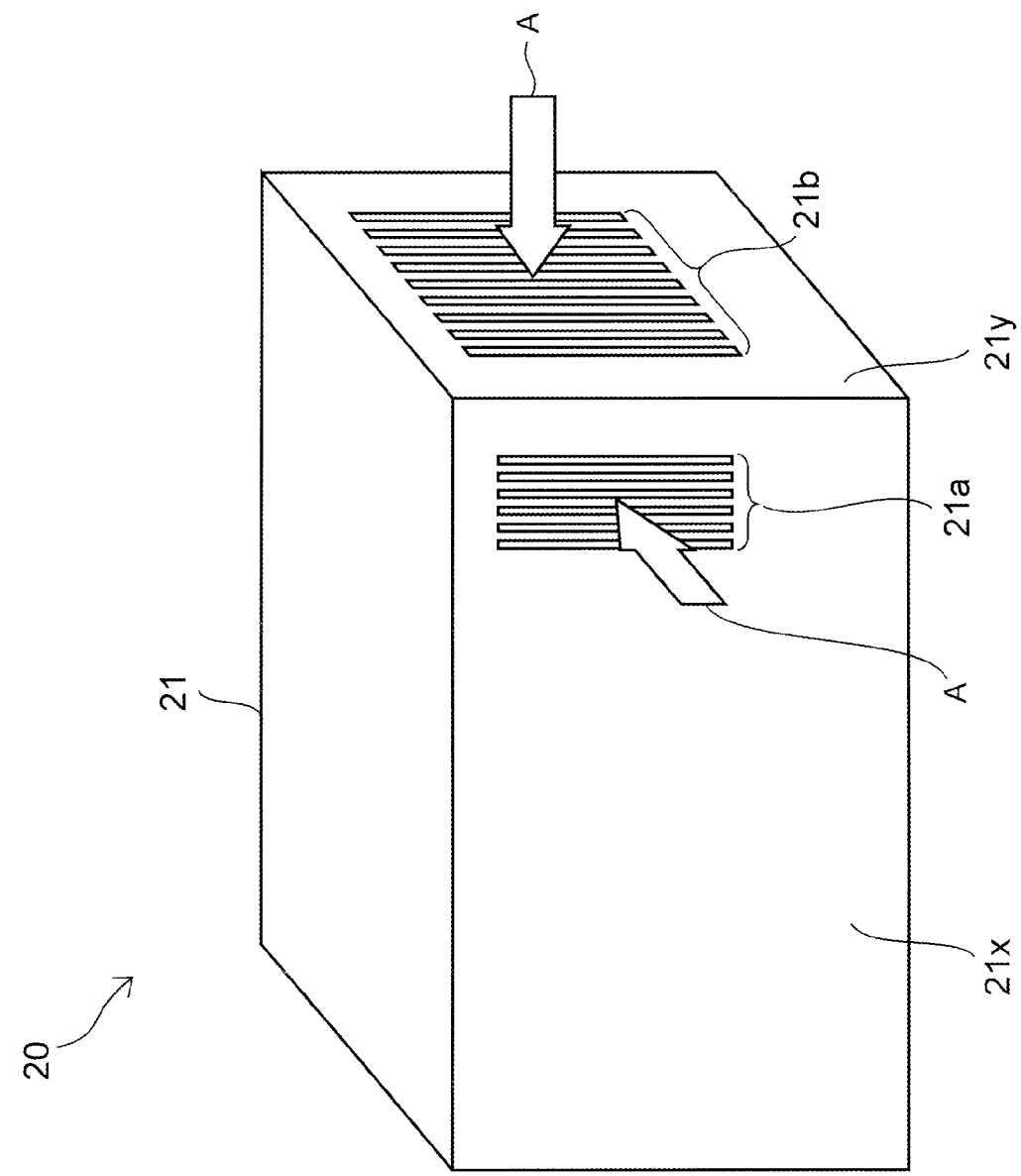
FIG. 2 is an external view of a module-type data center according to a first embodiment (part 1)

FIG. 2 is an external view of a data center 20 according to a first embodiment.

This data center 20 is a module-type data center, and includes a metallic container 21 as an example of a casing.

The container 21 has an outer shape of a cuboid, and is provided with a first intake opening 21a and a second intake opening 21b respectively on a right side surface 21x and a front surface 21y of the container 21 to take in outside air A used for air-cooling.

The first intake opening 21a and the second intake opening 21b are thus provided on the different surfaces of the container 21. For this reason, even if one of the first intake opening 21a and the second intake opening 21b receives a strong wind, the other one does not receive the strong wind. This facilitates the taking in of the outside air.

The shape of the first intake opening 21a is not limited. The first intake opening 21a may be formed as a group of a plurality of holes, or as a single opening. The same applies to the second intake opening 21b, as well.

The position to provide the first intake opening 21a is not limited, either. In this embodiment, the first intake opening 21a is provided on the right side surface 21x at a position close to the front surface 21y.

Figure 3:
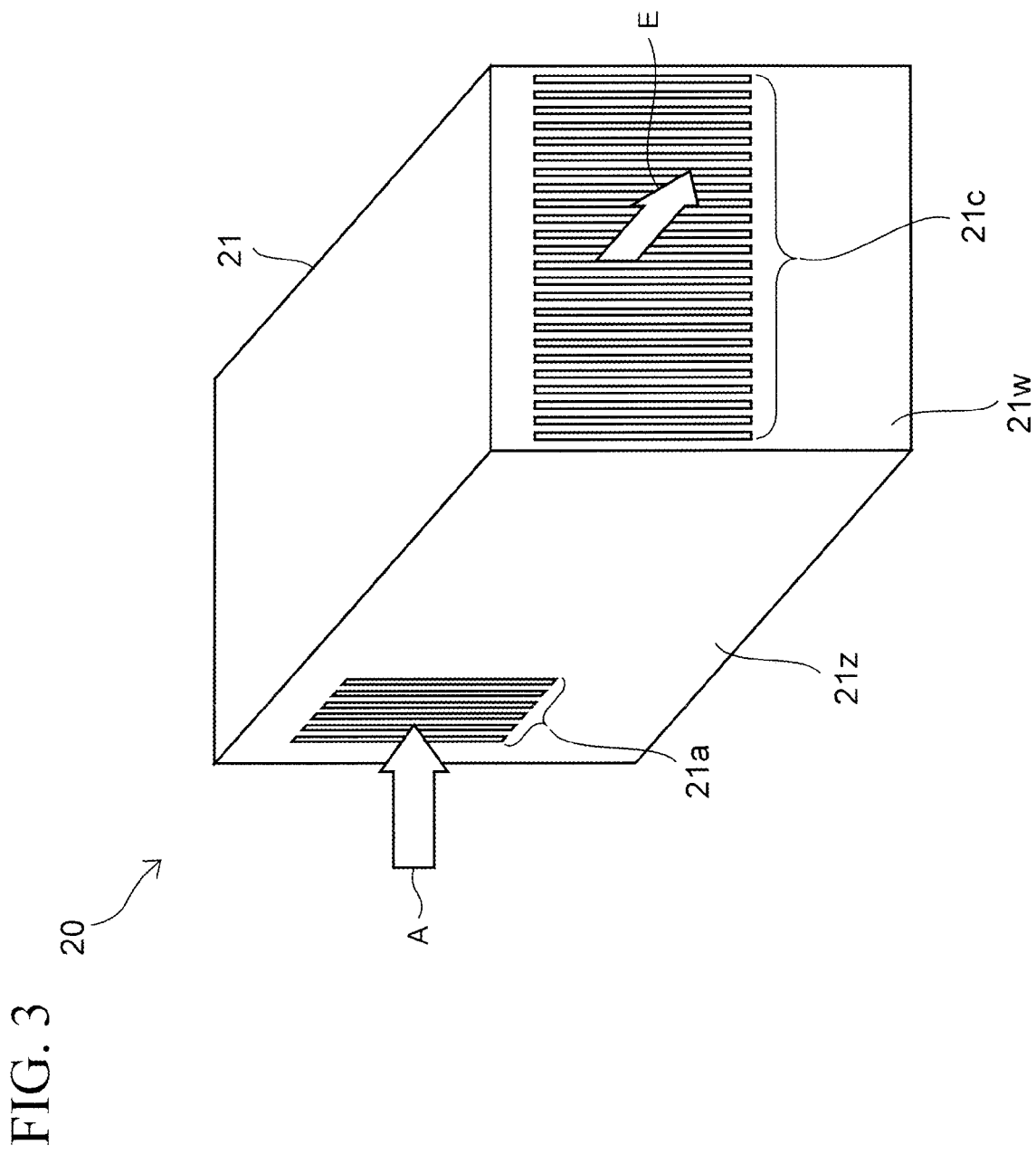
FIG. 3 is an external view of the module-type data center according to the first embodiment (part 2)

FIG. 3 is an external view of the data center 20 seen from behind.

As illustrated in FIG. 3, the first intake opening 21a is also provided on a left side surface 21z of the container 21. The container 21 is provided with an exhaust opening 21c on a back surface 21w thereof to discharge an exhaust airflow E used for air-cooling.

The size of the container 21 is not particularly limited. In this embodiment, the container 21 is about 2.3 m to 4.0 m in width, 2.5 m to 6.0 m in height, and 3.0 m to 12.5 m in depth.

The installation environment for the container 21 is not particularly limited, either. The container 21 may be installed either indoors or outdoors.

Figure 4:
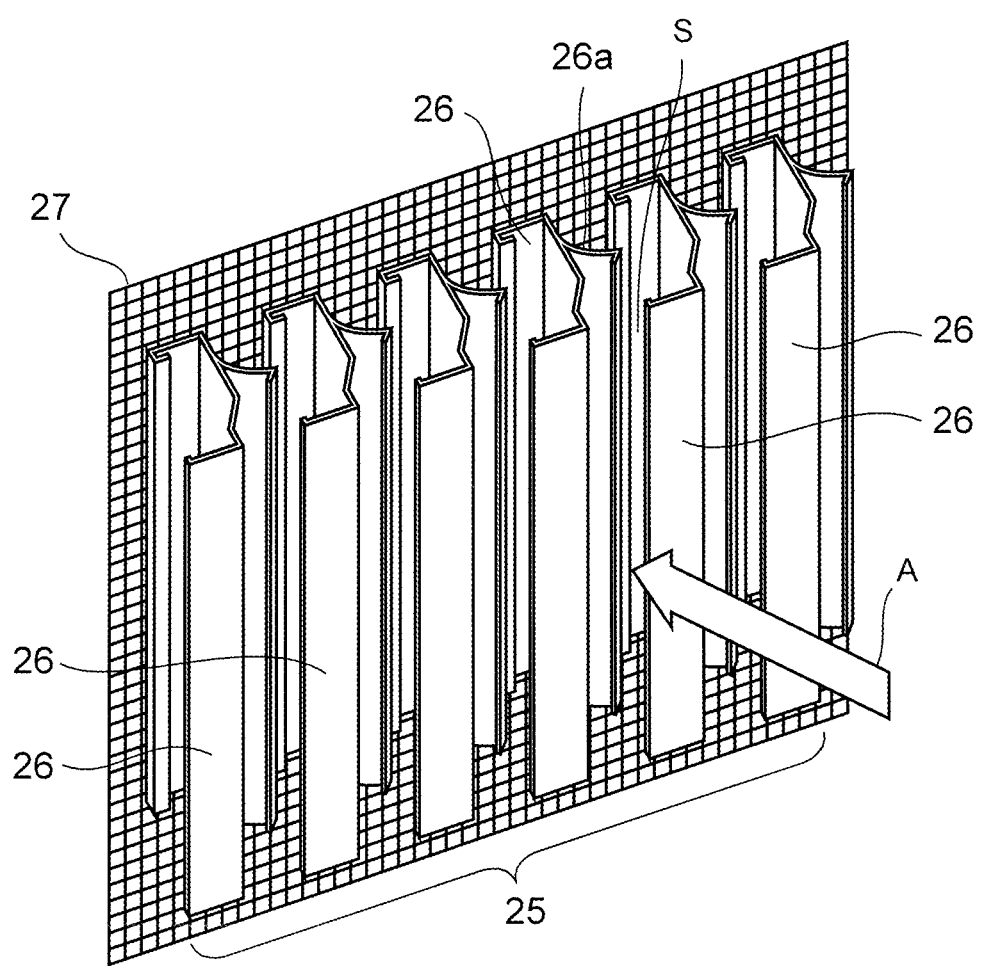
FIG. 4 is a perspective view of a louver and a filter used in the first embodiment.

FIG. 4 is a perspective view of a louver 25 and a filter 27 which are fit into each of the first intake openings 21a, the second intake opening 21b, and the exhaust opening 21c described above.

The louver 25 has a plurality of fins 26 extending vertically and provided at intervals. There is space S between each pair of adjacent fins 26 to allow the outside air A to flow therethrough. A protruding piece 26a is provided to each fin 26 to prevent ingress of rainwater into the container 21.

Specifications of the louver 25 are not particularly limited. In this embodiment, the fins 26 are formed with aluminum plates, and the space S accounts for about 50% of the exposed surface of the louver 25.

The use of the filter 27 together with the louver 25 prevents dust and insects from entering the container 21.

Figure 5:
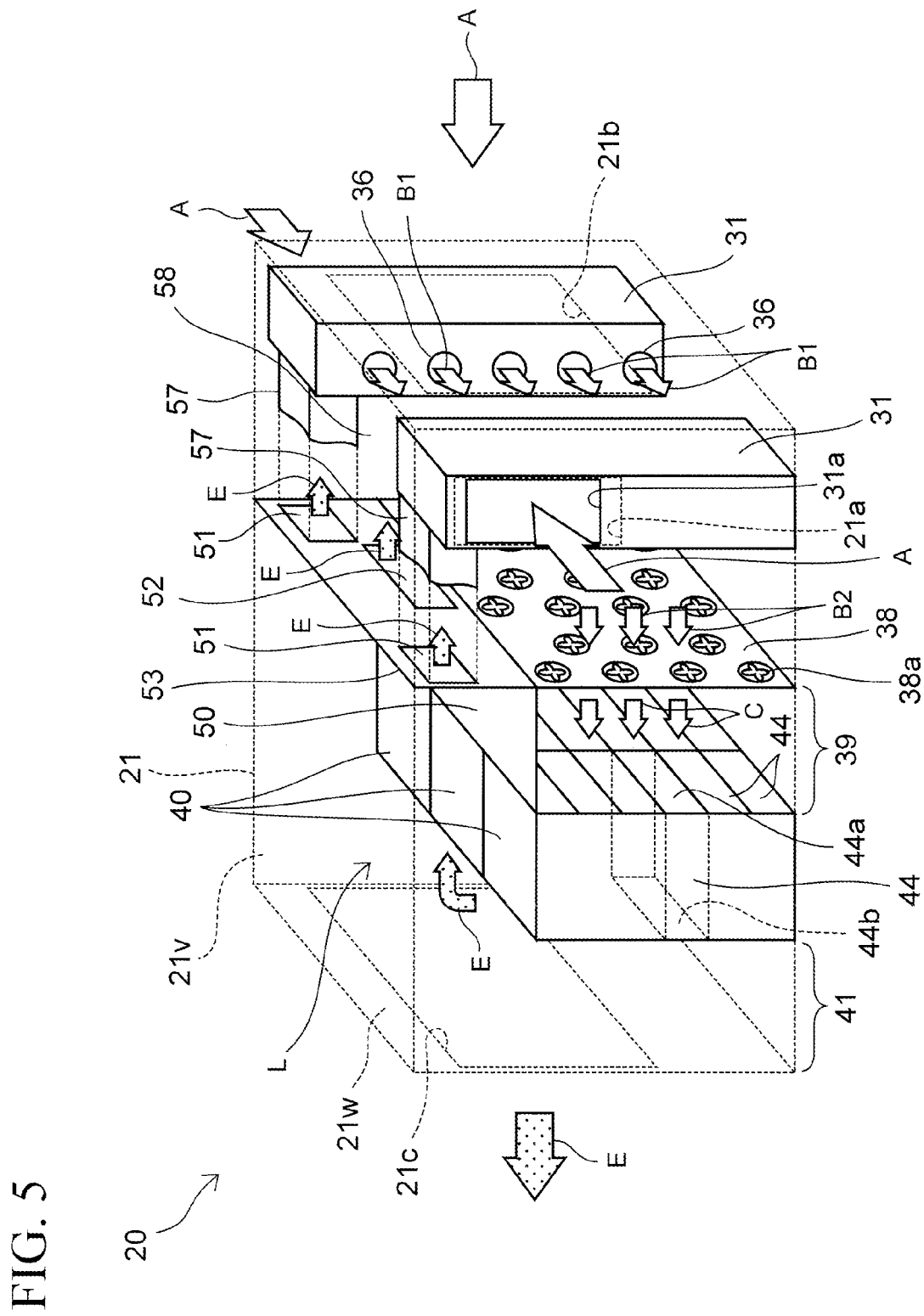
FIG. 5 is a perspective view illustrating the internal configuration of a container of the module-type data center according to the first embodiment.

FIG. 5 is a perspective view illustrating the internal configuration of the container 21.

In the container 21, air conditioners 31, a fan unit 38, and racks 40 are provided. Arrangement of these is not particularly limited. In this embodiment, the air conditioners 31, the fan unit 38, and the racks 40 are provided in the order mentioned from the upstream of the flow direction of the outside air A taken in through the second intake opening 21b.

Each air conditioner 31 is a vaporization cooling apparatus described earlier, and has an opening 31a for taking the outside air A in through the corresponding first intake opening 21a. The outside air A is used to air-cool the inside of the container 21, and the exhaust airflow E after the air-cooling is exhausted through the exhaust opening 21c.

Although two air conditioners 31 are provided in the container 21 in this example, the number of the air conditioners 31 is not limited to two. One or three or more air conditioners 31 may be provided.

Figure 6:
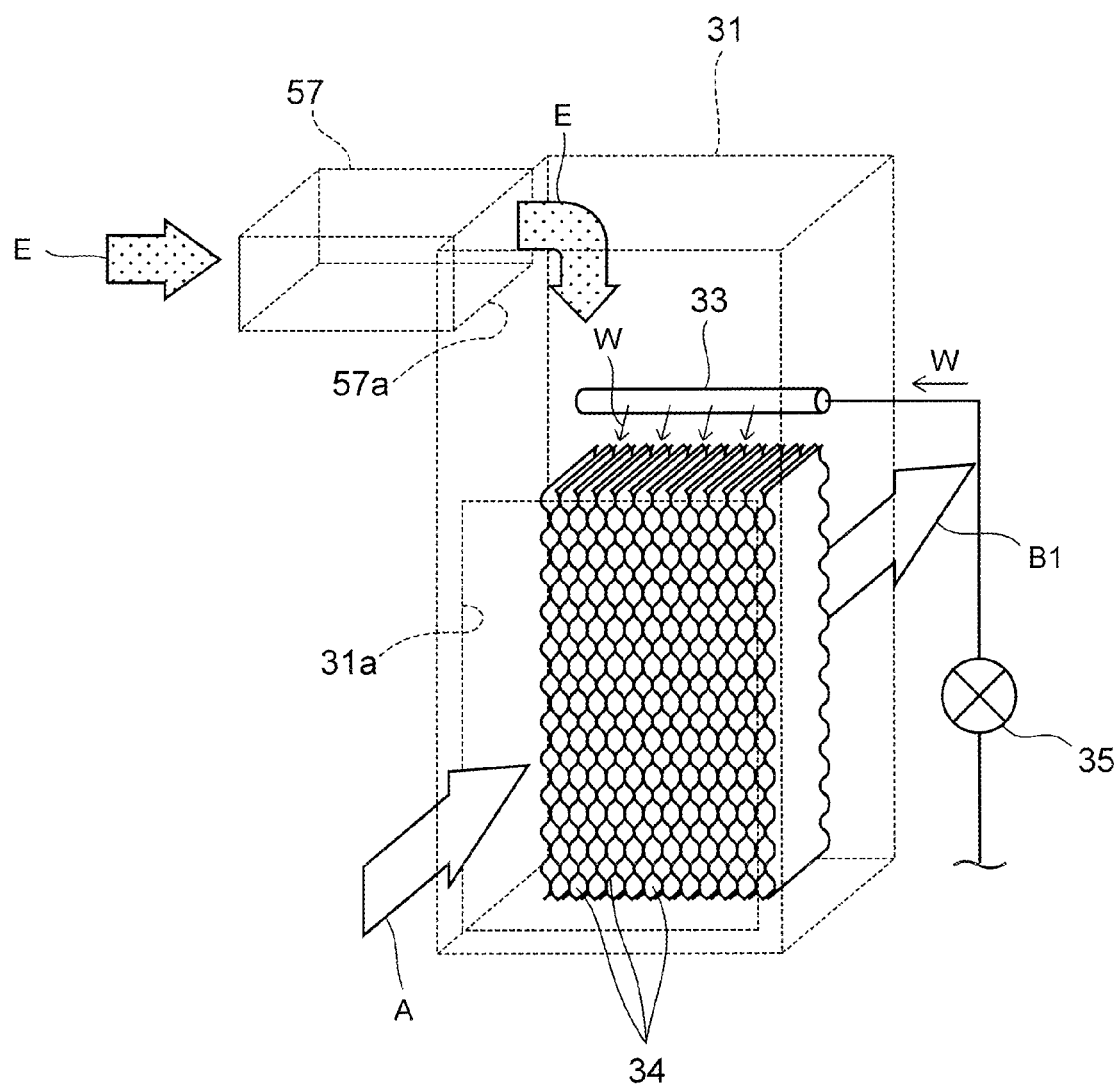
FIG. 6 is a partially-exploded perspective view of an air conditioner used in the first embodiment.

FIG. 6 is a partially-exploded perspective view of the air conditioner 31.

As illustrated in FIG. 6, the air conditioner 31 includes water-absorbing elements 34 each made by shaping polymer composite fibers, a nozzle 33 for dropping a refrigerant such as water W to the elements 34, an electromagnetic valve 35 configured to adjust the supply of the water W to the nozzle 33, and fans 36 (see FIG. 5).

In such an air conditioner 31, the fans 36 take the outside air A from the opening 31a into the air conditioner 31, and the outside air A then comes into direct contact with the water W contained in the elements 34. As a result, the outside air A is cooled by the evaporative latent heat of the water W and is also humidified. The outside air A thus adjusted in its temperature and humidity is discharged as the first airflow B1 to a stage succeeding the fans 36.

The air conditioner 31 is connected to a duct 57 through which part of the exhaust airflow E mentioned above flows. This exhaust airflow E is also humidified by the elements 34 and discharged as the airflow B1.

The electromagnetic valve 35 opens when the fans 36 start rotating. However, when the humidity of the outside air A is sufficiently high, the electromagnetic valve 35 is preferably closed to stop wasteful supply of the water W. In this embodiment, when the humidity of the outside air A exceeds a prescribed value, e.g., 85%, the electromagnetic valve 35 is closed under the control of a controller to be described later. Wasteful consumption of water resources is thus reduced.

The rotation speed of the fans 36 is not particularly limited, either. However, high-speed rotation of the fans 36 increases the wind speed of the airflow B1, causing splash of the water W. The splashed water W might cause a defect in the electronic devices inside the container 21. It is therefore preferable to adjust the rotation speed of the fans 36 so that the airflow B1 may have a wind speed below or equal to the upper-limit wind speed which does not cause splash of the water W. When the airflow B1 has about 80% humidity, the upper-limit wind speed is about 2.5 m/second.

FIG. 5 is referred to again.

The air conditioners 31 exclusively use their respective first intake openings 21a, so that the outside air A enters the air conditioners 31 through the first intake openings 21a.

On the other hand, the fan unit 38 is always in operation while the data center 20 is operating, and generates a second airflow B2 by rotating fans 38a to take in the outside air A through the second intake opening 21b.

The second airflow B2 and the first airflow B1 are mixed together upstream of the fan unit 38, and then become a mixed airflow C downstream of the fan unit 38.

In this embodiment, the fan unit 38 and the fans 36 of the air conditioners 31 may operate independently. Even when the fan unit 38 is in operation, the fans 36 may stop so as to generate the mixed airflow C with the second airflow B2.

The plurality of racks 40 are arranged in a width direction of the container 21. Each rack 40 includes a plurality of electronic devices 44, such as a server, to be air-cooled by the mixed airflow C. Each electronic device 44 has an intake surface 44a for taking the mixed airflow C into the electronic device 44. The electronic device 44 is cooled by the mixed airflow C taken in through the intake surface 44a. Then, the exhaust airflow E warmed up by the cooling is exhausted through an exhaust surface 44b of the electronic device 44, and is then released to the outside through the exhaust opening 21c of the container 21.

Space between each intake surface 44a and the opposite fan unit 38 serves as a cold aisle 39 through which the mixed airflow C passes. In addition, space between each exhaust surface 44b and the opposite exhaust opening 21c serves as a hot aisle 41 through which the exhaust airflow E warmed up by the electronic devices 44 passes.

In this embodiment, a ceiling 21v of the container 21 is higher than the racks 40, so that clearance L through which the exhaust airflow E flows is provided between the ceiling 21v and the racks 40. Part of the exhaust airflow E bounces back from the back surface 21w and passes through the clearance L, flowing into the space above the cold aisle 39.

Since the cold aisle 39 has a top panel 50 as its ceiling, the bounced-back exhaust airflow E does not directly enter the cold aisle 39. Moreover, since the total width of all the racks 40 equals the inner width of the container 21, the exhaust airflow E does not enter the cold aisle 39 along the side surfaces of the racks 40, either.

A partitioning plate 53 is provided on the fan unit 38. In order to prevent the exhaust airflow E from leaking from the outer edge of the partitioning plate 53, the partitioning plate 53 is formed such that its outer edge matches the inner shape of the container 21.

The partitioning plate 53 is provided with first opening-closing portions 51 and a second opening-closing portion 52. The first opening-closing portions 51 are each a damper capable of opening or closing, and the second opening-closing portion 52 is a damper capable of adjusting the flow rate of the exhaust airflow E through adjustment of the opening degree thereof in stepwise manner or continuously.

In a stage succeeding each of the first opening-closing portions 51, the duct 57 mentioned above is provided as a first flow channel. The duct 57 communicates with the corresponding first intake opening 21a at its opening end 57a (see FIG. 6), and leads the exhaust airflow E to the first intake opening 21a.

In addition, the inside of the container 21 at a portion upstream side of the fan unit 38 and around the ducts 57 serves as a second flow channel 58. The second flow channel 58 is separated from the ducts 57, and leads the exhaust airflow E to the upstream of the fan unit 38, the upstream being based on the flow direction of the outside air A.

In this embodiment, the racks 40 are accommodated inside the single container 21. For this reason, heat produced by the electronic devices 44 of the racks 40 is prevented from widely spreading, and the air conditioning efficiency of the container 21 may be increased by the fan unit 38 and the air conditioners 31.

The data center 20 is provided with sensors for temperature, humidity, and the like.

Figure 7:
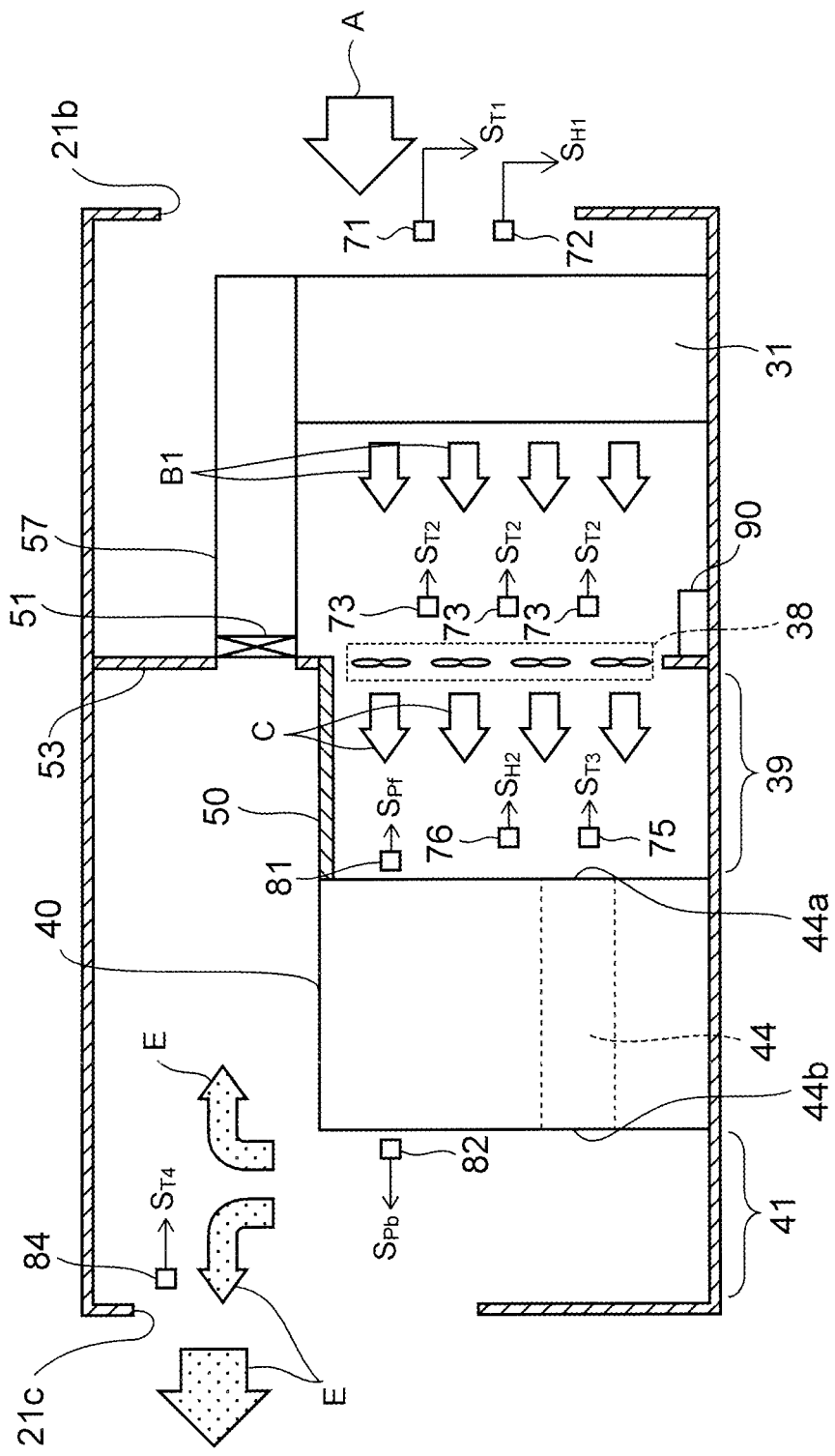
FIG. 7 is a cross-sectional view illustrating arrangement of various sensors in the module-type data center according to the first embodiment.

FIG. 7 is a cross-sectional view illustrating the arrangement of the various sensors.

In FIG. 7, portions which are the same as those illustrated in FIG. 5 are denoted by the same reference numerals as those used in FIG. 5, and are not described again below.

As illustrated in FIG. 7, a first temperature sensor 71 and a first humidity sensor 72 are provided near the second intake opening 21b.

The first temperature sensor 71 measures a temperature $T_A$ of the outside air A, and outputs the result as first temperature information $S_{T1}$. The first humidity sensor 72 measures a humidity $H_A$ of the outside air A, and outputs the result as first humidity information $S_{H1}$.

In addition, a plurality of second temperature sensors 73 are provided upstream of the fan unit 38 and measure the temperatures of the first airflows B1 generated by the air conditioners 31, and output the temperatures of the first airflows B1 as second temperature information $S_{T2}$.

In addition, a third temperature sensor 75 and a second humidity sensor 76 are provided near the intake surfaces 44a of the electronic devices 44 of the racks 40, and measure the temperature and the humidity of the intake surfaces 44a, respectively.

The third temperature sensor 75 outputs the temperature at the intake surfaces 44a as third temperature information $S_{T3}$, and the second humidity sensor 76 outputs the humidity at the intake surfaces 44a as second humidity information $S_{H2}$.

Moreover, a first pressure sensor 81 is provided near the intake surfaces 44a, and outputs a pressure $P_f$ at the intake surfaces 44a as first pressure information $S_{Pf}$.

Near the exhaust surfaces 44b, a second pressure sensor 82 and a fourth temperature sensor 84 are provided. The second pressure sensor 82 measures a pressure $P_b$ at the exhaust surfaces 44b and outputs the result as second pressure information $S_{Pb}$, and the fourth temperature sensor 84 measures the temperature on the exhaust surface 44b side and outputs the result as fourth temperature information $S_{T4}$.

Note that the first to fourth temperature information $S_{T1}$ to $S_{T4}$ all indicate dry-bulb temperature, and the first and second humidity information $S_{H1}$ and $S_{H2}$ both indicate relative humidity.

A controller 90 is provided inside the container 21, and receives input of the first to fourth temperature information $S_{T1}$ to $S_{T4}$ and the first and second humidity information $S_{H1}$ and $S_{H2}$.

Figure 8:
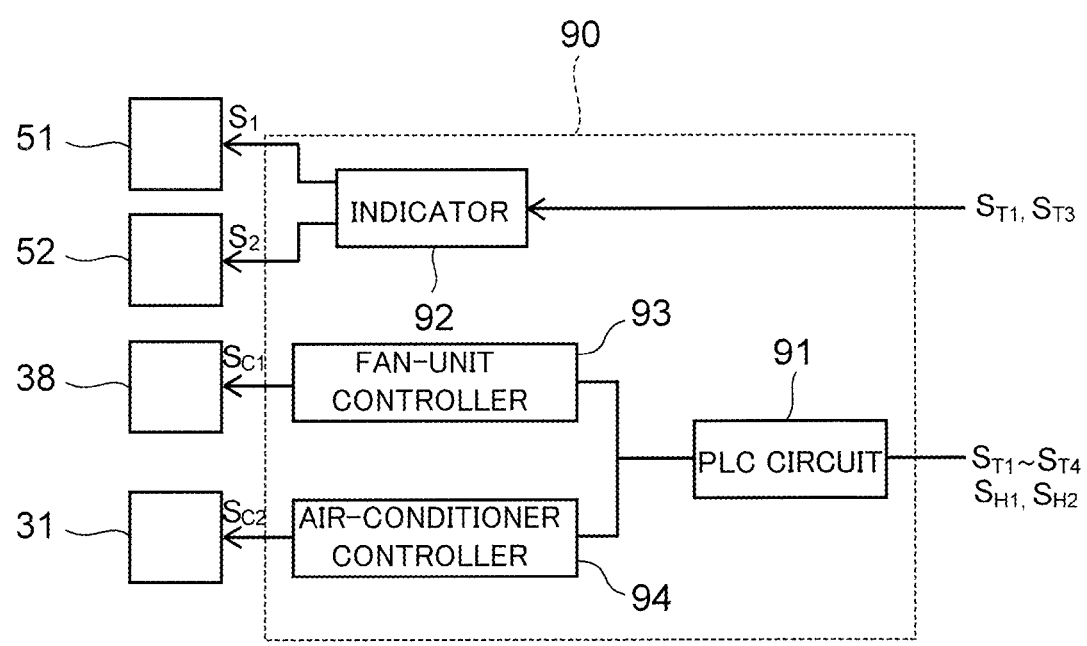
FIG. 8 is a functional block diagram of a controller of the module-type data center according to the first embodiment.

FIG. 8 is a functional block diagram of the controller 90.

The controller 90 includes a PLC (Programmable Logic controller) circuit 91, an indicator 92, a fan-unit controller 93, and an air-conditioner controller 94.

The indicator 92 determines, based on the first temperature information $S_{T1}$ indicating the temperature of the outside air A, whether to open or close the first opening-closing portions 51 and the second opening-closing portion 52.

When determining to open the first opening-closing portions 51, the indicator 92 outputs a first opening-closing signal $S_1$ to each of the first opening-closing portions 51 to open the first opening-closing portions 51.

On the other hand, when determining to open the second opening-closing portion 52, the indicator 92 determines the opening degree of the second opening-closing portion 52, and outputs a second opening-closing signal $S_2$ to the second opening-closing portion 52 to open the second opening-closing portion 52 at the opening degree determined. The indicator 92 uses the third temperature information $S_{T3}$ to determine the opening degree.

The PLC circuit 91 controls the fan-unit controller 93 and the air-conditioner controller 94 alternately at predetermined time intervals.

Under the control of the PLC circuit 91, the fan-unit controller 93 outputs a first control signal $S_{c1}$ to the fan unit 38. Then, the fan unit 38 rotates the fans 38a (see FIG. 5) with a rotation speed instructed by the first control signal $S_{c1}$. The fan-unit controller 93 determines the rotation speed based on the third temperature information $S_{T3}$ and the fourth temperature information $S_{T4}$ respectively indicating the temperature at the intake surfaces 44a and the temperature at the exhaust surfaces 44b.

Under the control of the PLC circuit 91, the air-conditioner controller 94 outputs a second control signal $S_{c2}$ to the air conditioner 31. The second control signal $S_{c2}$ contains an on-off signal for the fans 36 (see FIG. 5) and a switch signal for the electromagnetic valve 35. The switch signal for the electromagnetic valve 35 is used to close the electromagnetic valve 35 when the humidity of the outside air A exceeds the prescribed value, as described earlier.

The controller 90 generates the second control signal $S_{c2}$ based on the second humidity information $S_{H2}$ indicating the humidity of the mixed airflow C, the first temperature information $S_{T1}$ indicating the temperature of the outside air A, and the first humidity information $S_{H1}$ indicating the humidity of the outside air A.

The controller 90 thus controls the behaviors of the air conditioners 31, the fan unit 38, and the first and second opening-closing portions 51 and 52 to generate the mixed airflow C having suitable temperature and humidity for operation of the electronic devices 44 as described below.

Figure 9:
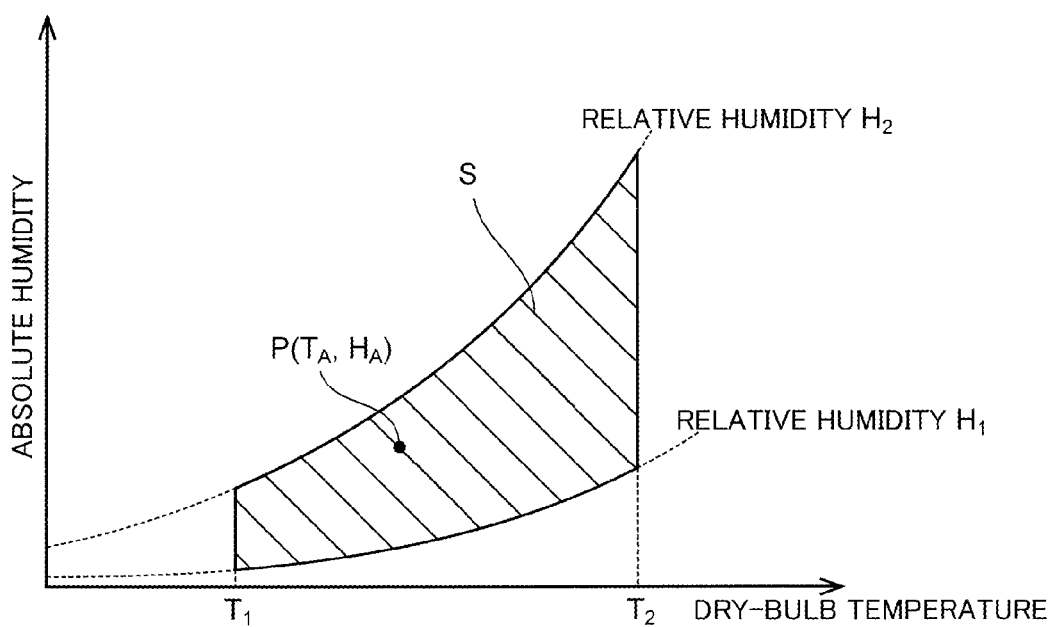
FIG. 9 is a psychrometric chart.

FIG. 9 is a psychrometric chart. This psychrometric chart is formed by plotting curves of equal relative humidity, with its horizontal axis indicating the dry-bulb temperature and its vertical axis indicating the absolute humidity.

For the electronic devices 44, a temperature range $T_1$ to $T_2$ and a humidity range $H_1$ to $H_2$ in which the operation of the electronic devices 44 is guaranteed are set. These temperature range and humidity range are depicted as an operation-guaranteed range S in FIG. 9. The border of the operation-guaranteed range S depends on the types of the electronic devices 44.

In the following, as an example, the temperature range $T_1$ to $T_2$ is 10° C. to 35° C., and the humidity range $H_1$ to $H_2$ is 10% to 85%. The lower-limit value and the upper-limit value of the temperature range are threshold limit values at which semiconductor integrated circuits (not illustrated) inside the electronic devices 44 may normally operate. The lower-limit value of the humidity range is an approximate value at which the electronic devices 44 might be damaged by the static electricity caused by dry air, and the upper-limit value of the humidity range is a value at which the electronic devices 44 might suffer from condensation due to humid air.

When a status point P which is the coordinate point of the dry-bulb temperature $T_A$ and the relative humidity $H_A$ of the outside air A is inside this operation-guaranteed range S, the outside air A may be used as-is to air-cool the electronic devices 44.

On the other hand, when the status point P is outside the operation-guaranteed range S, the outside air A is adjusted so that the status point P may fall within the operation-guaranteed range S.

The data center 20 according to this embodiment operates in any of the following first to fourth operation modes, depending on where the status point P of the outside air A is in the psychrometric chart.

(First Operation Mode)

Figure 10A:
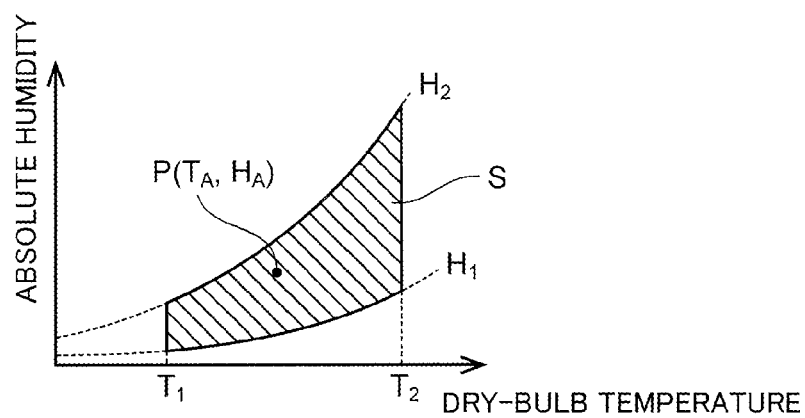
FIG. 10A is a psychrometric chart depicting the position of a status point for a first operation mode of the module-type data center according to the first embodiment.
Figure 10B:
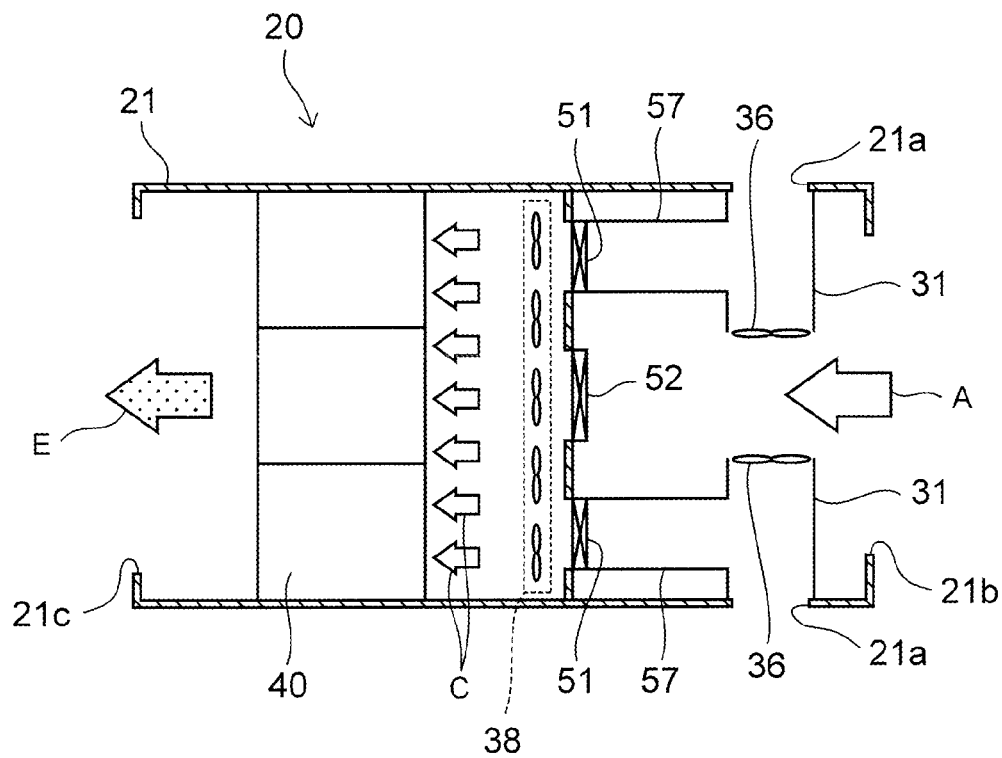
FIG. 10B is a cross-sectional view of the module-type data center according to the first embodiment in the first operation mode.

FIG. 10A is a psychrometric chart depicting the position of the status point P for the first operation mode, and FIG. 10B is a cross-sectional view of the data center 20 in the first operation mode.

As illustrated in FIG. 10A, the first operation mode is employed when the status point P of the outside air A is inside the operation-guaranteed range S.

In this case, the outside air A does not have to be adjusted. Thus, as illustrated in FIG. 10B, under the control of the controller 90, the fans 36 of the air conditioner 31 are stopped, and the electromagnetic valve 35 (see FIG. 6) is closed to stop the water W from dropping to the elements 34.

In addition, the first and second opening-closing portions 51 and 52 are closed under the control of the controller 90 so that the mixed airflow C does not increase in temperature by being mixed with the exhaust airflow E.

In this mode, the fans 36 are stopped because the outside air A does not have to be adjusted. Thus, the fans 36 do not wastefully consume power, which contributes to energy-saving of the module-type data center 20.

Moreover, while the fans 36 are stopped in this mode, no outside air A flows through the first intake openings 21a because the air conditioners 31 exclusively use the respective first intake openings 21a. Thereby, it takes more time for the filter 27 (see FIG. 4) of each first intake opening 21a to clog up than for the filter in FIG. 1.

(Second Operation Mode)

Figure 11A:
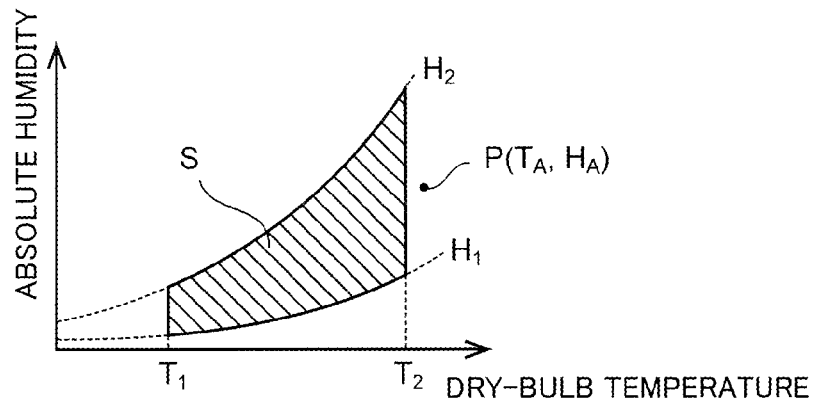
FIG. 11A is a psychrometric chart depicting the position of the status point for a second operation mode of the module-type data center according to the first embodiment.
Figure 11B:
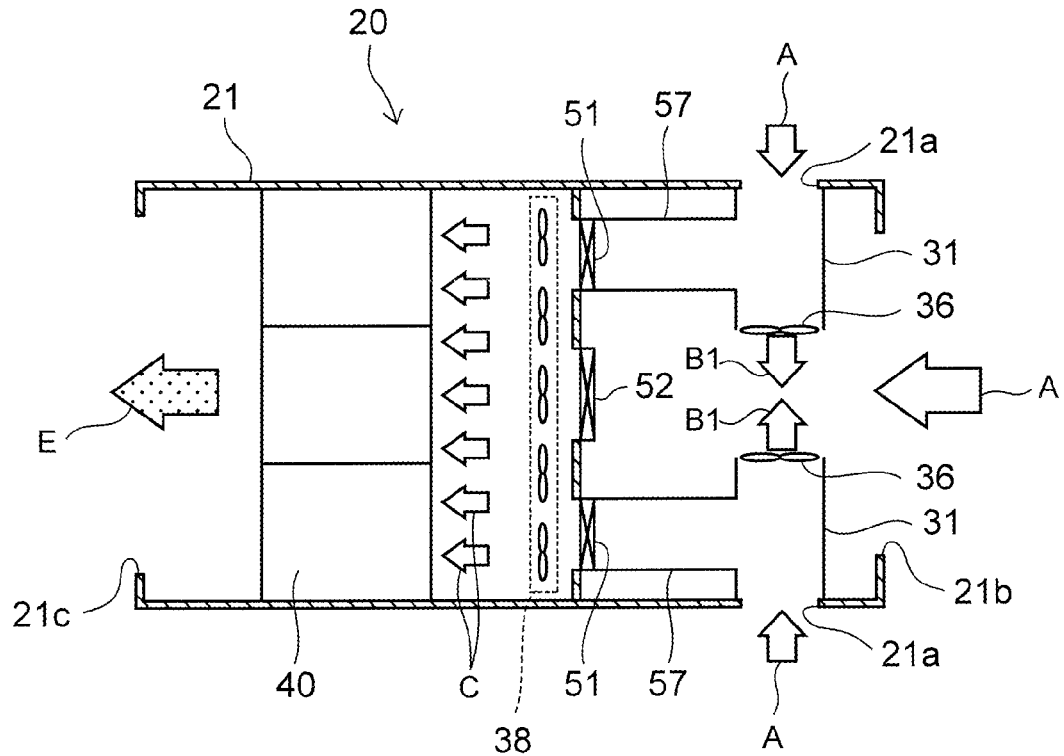
FIG. 11B is a cross-sectional view of the module-type data center according to the first embodiment in the second operation mode.

FIG. 11A is a psychrometric chart depicting the position of the status point P for the second operation mode, and FIG. 11B is a cross-sectional view of the data center 20 in the second operation mode.

As illustrated in FIG. 11A, the second operation mode is employed when the status point P of the outside air A is rightward of the operation-guaranteed range S because the temperature $T_A$ of the outside air A exceeds the upper-limit temperature $T_2$ of the operation-guaranteed range S.

In this case, to cool the outside air A, under the control of the controller 90, the fans 36 (see FIG. 5) of the air conditioners 31 are driven, and the electromagnetic valve 35 (see FIG. 6) is opened to drop the water W to the elements 34 (see FIG. 6), as illustrated in FIG. 11B.

The first airflow B1 thus cooled by the air conditioners 31 decreases the temperature of the mixed airflow C, allowing the status point P of the mixed airflow C to fall within the operation-guaranteed range S.

Also in this mode, the first and second opening-closing portions 51 and 52 are closed under the control of the controller 90 so that the mixed airflow C does not increase in temperature by being mixed with the exhaust airflow E.

The rotation speed of the fans 36 in this mode is not particularly limited. The rotation speed may be fixed, or may be controlled by the controller 90. If the rotation speed is controlled, it is preferable that the controller 90 performs feedback control of the rotation speed so that, for example, the humidity of the mixed airflow C, indicated by the second humidity information $S_{H2}$ (see FIG. 7), may equal a target humidity $H_0$ inside the operation-guaranteed range S.

(Third Operation Mode)

Figure 12A:
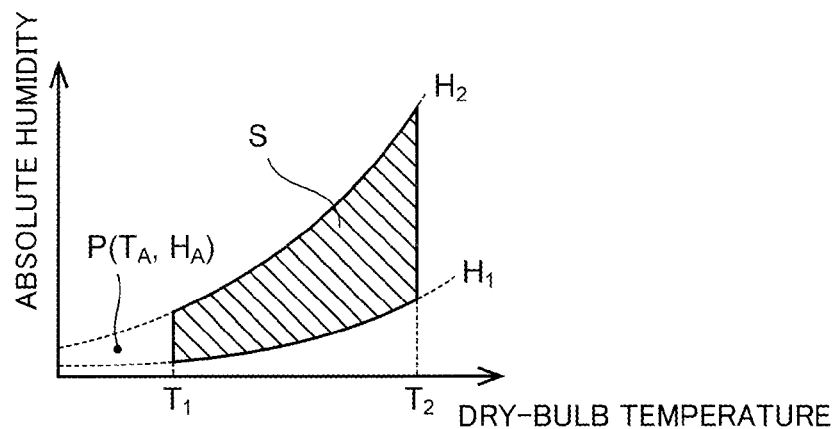
FIG. 12A is a psychrometric chart depicting the position of the status point for a third operation mode of the module-type data center according to the first embodiment.
Figure 12B:
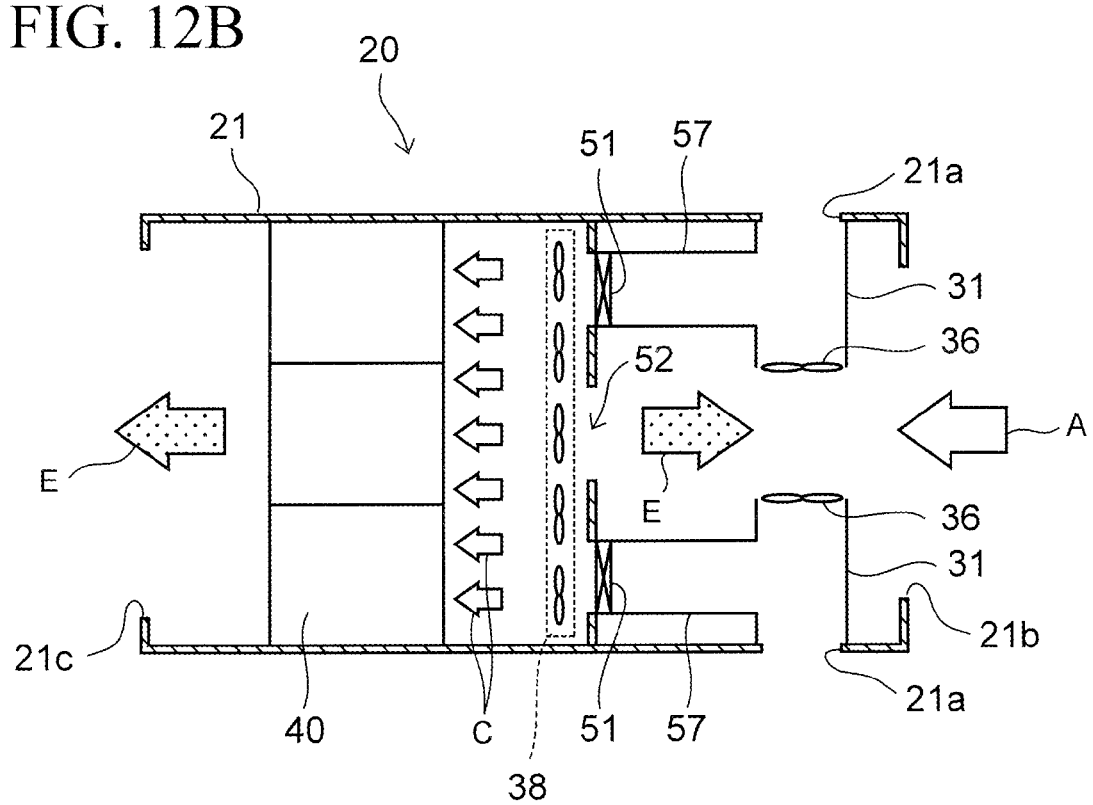
FIG. 12B is a cross-sectional view of the module-type data center according to the first embodiment in the third operation mode.

FIG. 12A is a psychrometric chart depicting the position of the status point P for the third operation mode, and FIG. 12B is a cross-sectional view of the data center 20 in the third operation mode.

As illustrated in FIG. 12A, the third operation mode is employed when the status point P of the outside air A is leftward of the operation-guaranteed range S because the temperature $T_A$ of the outside air A is below the lower-limit temperature $T_1$ of the operation-guaranteed range S.

In this case, as illustrated in FIG. 12B, the fans 36 of the air conditioners 31 are stopped rotating. At the same time, in order to warm up the mixed airflow C with the exhaust airflow E, the second opening-closing portion 52 is opened under the control of the controller 90.

Thereby, the exhaust airflow E flows to the upstream of the fan unit 38, the upstream being based on the flow direction of the outside air A. The exhaust airflow E is then mixed with the outside air A. As a result, the mixed airflow C increases in temperature, and the status point P of the mixed airflow C may fall within the operation-guaranteed range S.

The controller 90 preferably controls the opening degree of the second opening-closing portion 52 to adjust the flow rate of the exhaust airflow E flowing through the second opening-closing portion 52, so that the status point P may always stay within the operation-guaranteed range S. In this case, the controller 90 may perform feedback control of the opening degree of the second opening-closing portion 52 so that the temperature of the mixed airflow C, indicated by the third temperature information $S_{T3}$ from the third temperature sensor 75 (see FIG. 7), may equal a target temperature $T_0$ inside the operation-guaranteed range S.

(Fourth Operation Mode)

Figure 13A:
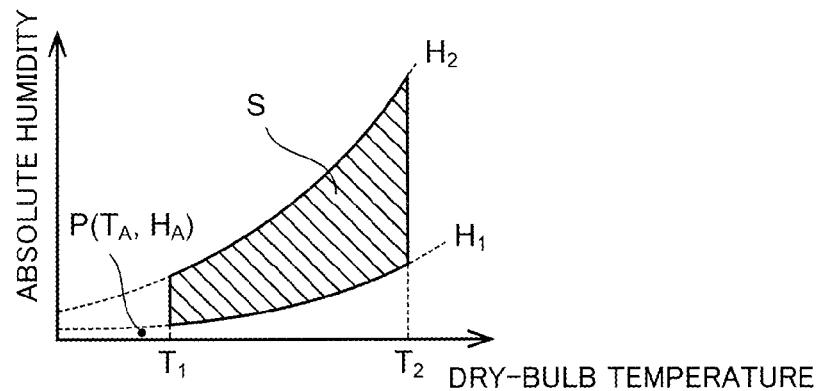
FIG. 13A is a psychrometric chart depicting the position of the status point for a fourth operation mode of the module-type data center according to the first embodiment.
Figure 13B:
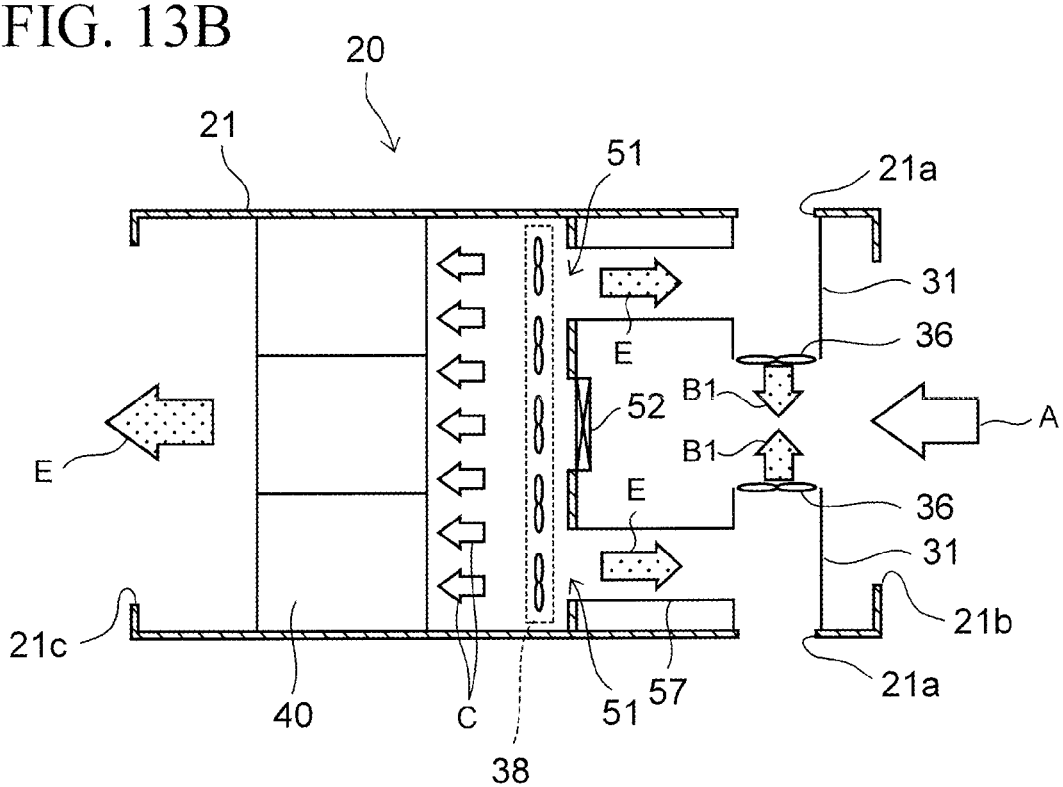
FIG. 13B is a cross-sectional view of the module-type data center according to the first embodiment in the fourth operation mode.

FIG. 13A is a psychrometric chart depicting the position of the status point P for the fourth operation mode, and FIG. 13B is a cross-sectional view of the data center 20 in the fourth operation mode.

As illustrated in FIG. 13A, the fourth operation mode is employed when the temperature $T_A$ of the outside air A is below the lower-limit temperature $T_1$ of the operation-guaranteed range S and also when the humidity $H_A$ of the outside air A is below the lower-limit humidity $H_1$ of the operation-guaranteed range S. In this case, the status point P of the outside air A is located outside the operation-guaranteed range S at the bottom left thereof.

In this mode, as illustrated in FIG. 13B, under the control of the controller 90, the first airflow B1 is generated by operating the fans 36 (see FIG. 5) of the air conditioner 31, and the electromagnetic valve 35 (see FIG. 6) is opened to drop the water W from the nozzle 33 to the elements 34.

In addition, in order to warm up the outside air A with the exhaust airflow E, the first opening-closing portions 51 are opened under the control of the controller 90.

Thereby, the exhaust airflow E is taken into the air conditioners 31 via the ducts 57 to allow the temperature of the mixed airflow C to be increased by the exhaust airflow E. Moreover, the exhaust airflow E may also increase the humidity of the mixed airflow C since the exhaust airflow E flows through the air conditioners 31 and gives moisture to the first airflows B1.

As a result, both of the temperature and the humidity of the mixed airflow C increase, enabling the status point P of the mixed airflow C to fall within the operation-guaranteed range S. The electronic devices 44 may therefore be humidified and warmed up with the mixed airflow C.

The second opening-closing portion 52 may be closed, or may be controlled in its opening degree under the control of the controller 90 when there is not enough exhaust airflow E from the first opening-closing portions 51. With the exhaust airflow E humidified by the air conditioners 31, the mixed airflow C may be humidified more efficiently than a case of using the outside air A which is low in both temperature and humidity.

In this mode, rotation of the fans 36 causes a certain amount of the outside air A to be taken into the container 21 through the first intake openings 21a. However, the exhaust airflow E supplied from the ducts 57 is predominant over the outside air A. Thus, the temperature of the mixed airflow C does not decrease.

Operation of the data center 20 is not limited to the above.

Figure 14:
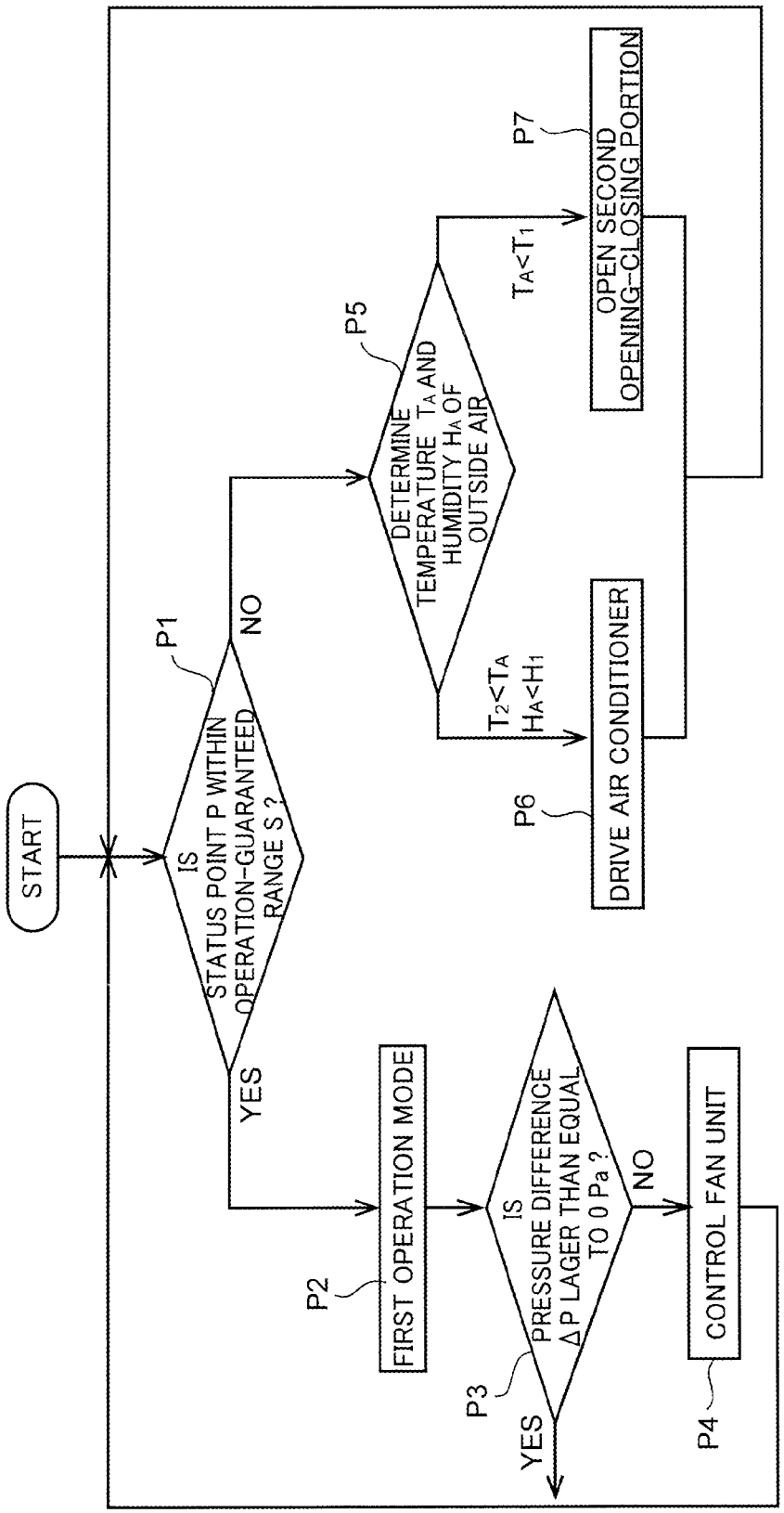
FIG. 14 is a flowchart illustrating a method of controlling the module-type data center according to the first embodiment.

FIG. 14 is a flowchart illustrating another example of a method of controlling the data center 20.

First, in Step P1, the controller 90 determines, based on the first temperature information $S_{T1}$ and the first humidity information $S_{H1}$ in FIG. 7, whether the status point P ($T_A$, $H_A$) of the outside air A is inside the operation-guaranteed range S.

If it is determined that the status point P ($T_A$, $H_A$) is inside the operation-guaranteed range S (YES), the flow proceeds to Step P2 for operation in the first operation mode described earlier (see FIG. 10B).

On the other hand, if it is determined in Step P1 that the status point P ($T_A$, $H_A$) is not inside the operation-guaranteed range S (NO), the flow proceeds to Step P5.

In Step P5, the controller 90 determines the temperature $T_A$ and the humidity $H_A$ of the outside air A based on the first temperature information $S_{T1}$ and the first humidity information $S_{H1}$.

If the determination concludes that the temperature $T_A$ of the outside air A exceeds the upper-limit temperature $T_2$ of the operation-guaranteed range S and that the humidity $H_A$ of the outside air A is below the lower-limit humidity $H_1$ of the operation-guaranteed range S, the flow proceeds to Step P6.

In Step P6, the fans 36 (see FIG. 5) of the air conditioners 31 are rotated, and the electromagnetic valve 35 (see FIG. 6) is opened to supply the water W to the elements 34. Thereby, the outside air A at a high temperature and a low humidity is cooled and humidified.

On the other hand, if the temperature $T_A$ of the outside air A is determined to be below the lower-limit temperature $T_1$ of the operation-guaranteed range S in Step P5, the flow proceeds to Step P7 where the second opening-closing portions 52 (see FIG. 5) are opened. Thereby, the exhaust E flows through the second opening-closing portions 52 to travel to the upstream side of the fan unit 38 and consequently warms up the mixed airflow C.

After Steps P6 and P7, the flow returns to Step P1.

In addition, when a predetermined period of time passes after execution of the first operation mode in Step P2, the flow proceeds to Step P3.

In Step P3, the controller 90 determines, based on the first pressure information $S_{Pf}$ and the second pressure information $S_{Pb}$ described earlier, whether or not a difference ΔP between the pressure $P_f$ at the intake surfaces 44a and the pressure Pb at the exhaust surfaces 44b (ΔP=$P_f$−$P_b$) is larger than or equal to 0 Pa.

If it is determined that the difference ΔP is larger than or equal to 0 Pa (YES), the flow returns to Step P1.

If, on the other hand, it is determined that the difference ΔP is not larger than or equal to 0 Pa (NO), it is conceivable that there is not enough mixed airflow C to cool the electronic devices 44. Hence, in this case, the flow proceeds to Step P4 where the fan unit 38 is controlled to increase the rotation speed of the fans 38a (see FIG. 5) of the fan unit 38.

A method of controlling the fans 38a in Step P4 is not particularly limited. For instance, the following method may be employed. Specifically, the controller 90 measures a temperature difference ΔT between the intake surfaces 44a and the exhaust surfaces 44b, reads a rotation speed for the fans 38a suitable for the temperature difference ΔT from a table (not illustrated), and rotates the fans 38a with that rotation speed.

In such a case, the temperature difference ΔT may be calculated by the controller 90 using the third temperature information $S_{T3}$ outputted from the third temperature sensor 75 and the fourth temperature information $S_{T4}$ outputted from the fourth temperature sensor 84, illustrated in FIG. 7.

Alternatively, the controller 90 may perform feedback control of the rotation speed of the fans 38a of the fan unit 38 according to the amount of heat produced by the racks 40 so that the temperature difference ΔT may equal a controlled temperature $T_c$. The controlled temperature $T_c$ in this case is, for example, about 8° C.

After Step P4, Step P1 is performed again.

With that, the basic steps of the method of controlling the data center according to this embodiment end.

According to the embodiment described above, the first intake openings 21a through which the air conditioners 31 take in the outside air A and the second intake opening 21b through which the fan unit 38 takes in the outside air A are provided on the different surfaces of the container 21, as illustrated in FIG. 2.

For this reason, even if a strong wind strikes one of the surfaces of the container 21, one of the first intake opening 21a and the second intake opening 21b receives the strong wind less than the other one. This facilitates the taking in of the outside air A.

Moreover, since the air conditioners 31 exclusively use their respective first intake openings 21a, the outside air A does not flow through the first intake openings 21a while the fans 36 (see FIG. 5) of the air conditioners 31 are stopped. Thereby, it takes more time for the filter 27 (see FIG. 4) to clog up than for the filter in FIG. 1.

Further, the fan unit 38 is provided separately from the air conditioners 31 as illustrated in FIG. 5. Thus, when the fan unit 38 takes in the outside air A, the flow of the outside air A is not hindered by the elements 34 (see FIG. 6) of the air conditioner 31. Thus, the power by the fan unit 38 to obtain the mixed airflow C at a predetermined flow speed is smaller than the power by the case in FIG. 1. The module-type data center 20 consuming low power may therefore be obtained.

The inventors of the present application examine how much power may be reduced approximately by this embodiment.

Figure 15:
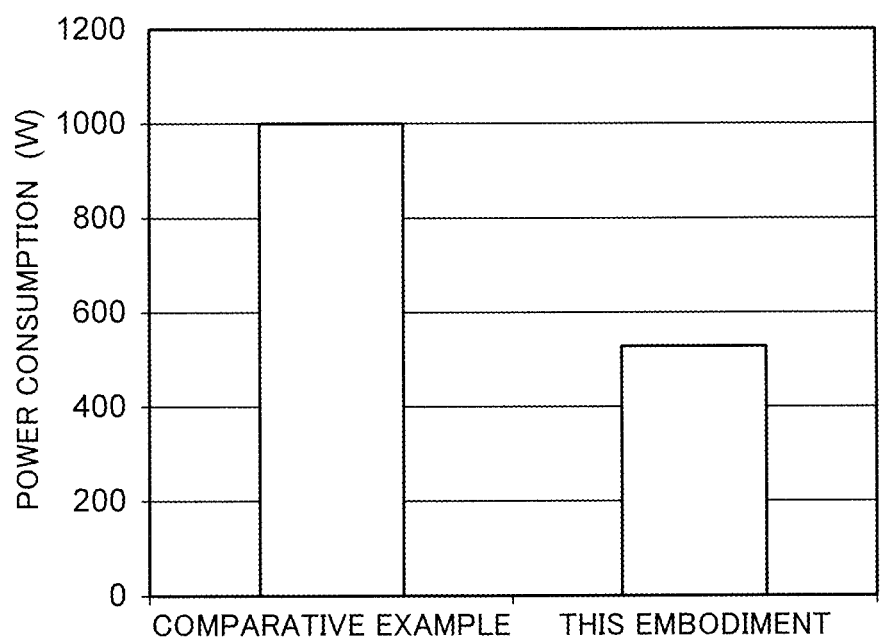
FIG. 15 is a diagram illustrating a result of examination as to power consumed by the module-type data center according to the first embodiment.

FIG. 15 illustrates the examination result. FIG. 15 also depicts power consumption by the module-type data center 1 illustrated in FIG. 1 as a comparative example.

In this examination, power consumed by the fan unit 38 to generate an airflow having an air volume of 9200 m³/h by taking in the outside air A through the second intake opening 21b is examined. The pressure difference between the inlet and outlet of the second intake opening 21b is about 15 Pa. In this case, power consumed by the fan unit 38 is about 540 W.

On the other hand, the pressure difference between the inlet and outlet of the air conditioner 3 of the comparative example (see FIG. 1) is as large as 150 Pa. This is because, as described earlier, the elements 3b of the air conditioner 3 hinder the flow of the outside air A. The air conditioner 3 of the comparative example consumes 1008 W to generate an airflow having an air volume of 9200 m³/h, which is the same as that in this embodiment, under such a pressure difference.

This result reveals that the power consumed in this embodiment is 46% of that in the comparative example, and therefore power may be reduced.

Further, in this embodiment, the fans 36 of the air conditioners 31 are operated independently from the fan unit 38. Thus, the fans 36 can be stopped when they do not have to rotate as in the first operation mode (FIGS. 10A and 10B). As a result, extra power consumption by the fans 36 may be suppressed to achieve further energy-saving.

Second Embodiment

In the first embodiment, the exhaust opening 21c is provided on the back surface 21w of the container 21, as illustrated in FIG. 3.

In contrast to this, in a second embodiment, the exhaust opening 21c is provided on the front surface of the container 21, as described below.

Figure 16:
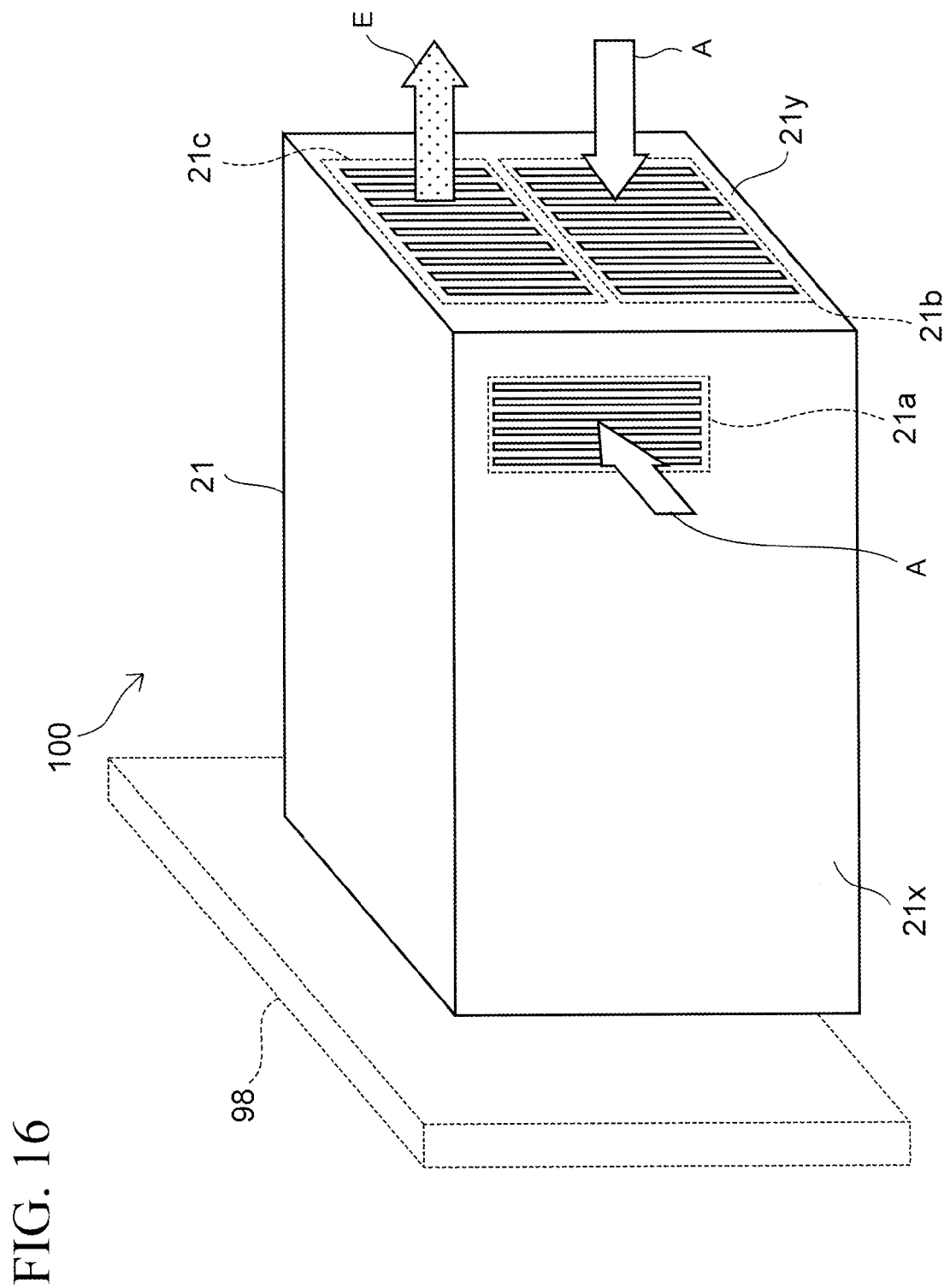
FIG. 16 is an external view of a module-type data center according to a second embodiment.

FIG. 16 is an external view of a module-type data center according to this embodiment. In FIG. 16, portions which are the same as those illustrated in the first embodiment are denoted by the same reference numerals as those used in the first embodiment, and are not described again below.

As illustrated in FIG. 16, in a module-type data center 100 according to this embodiment, the exhaust opening 21c is provided in the front surface 21y of the container 21 at a position above the second intake opening 21b. The container 21 is provided with no opening in its back surface.

By thus providing the exhaust opening 21c on the front surface 21y, even if there is a wall 98, such as a building, at the back-surface side of the container 21, waste heat inside the container 21 may be speedily released to the outside without the wall 98 blocking the flow of the exhaust airflow E exiting the exhaust opening 21c.

Consequently, limitations as to the installation location of the container 21 are mitigated to meet the convenience of a user.

Figure 17:
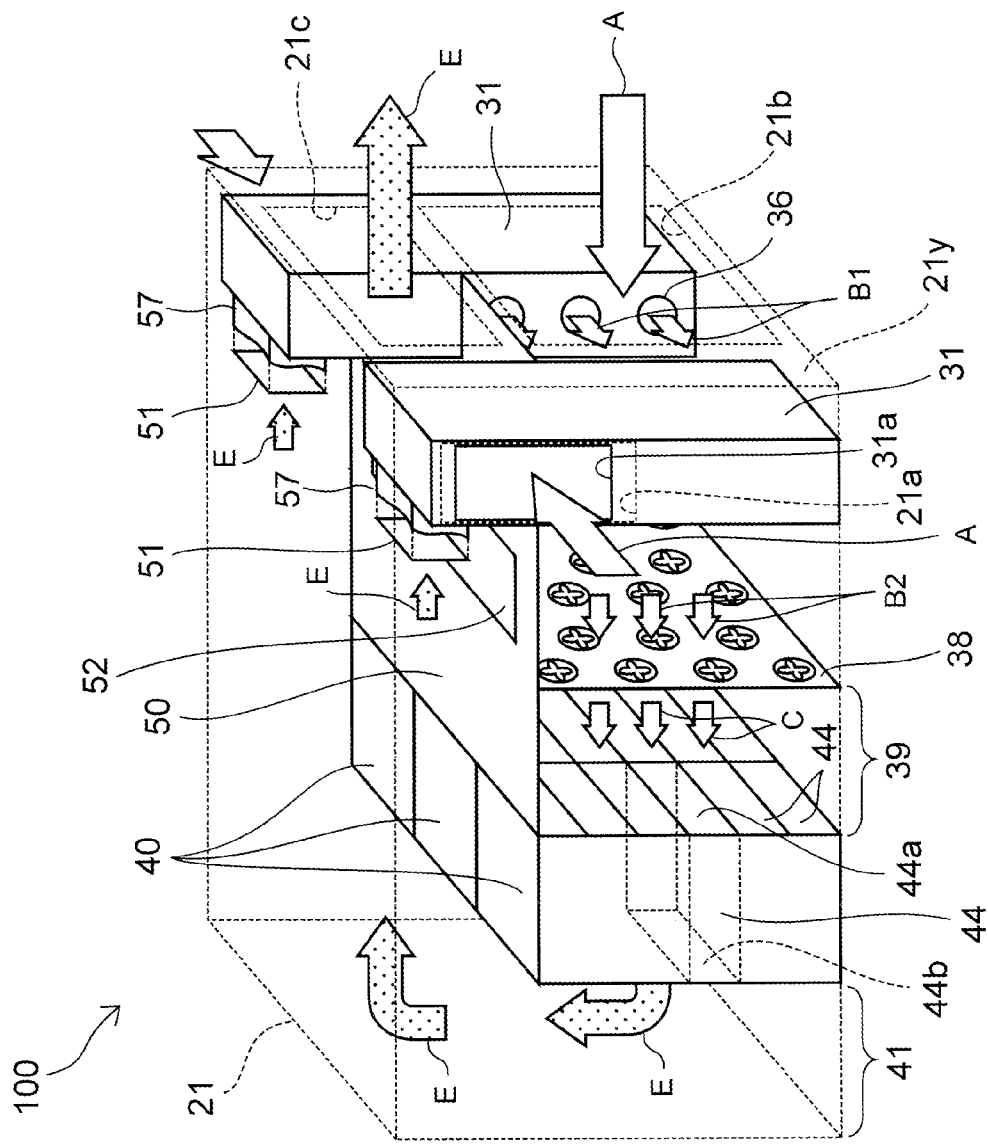
FIG. 17 is a perspective view illustrating the internal configuration of a container of the module-type data center according to the second embodiment.

FIG. 17 is a perspective view illustrating the internal configuration of the container 21 of this module-type data center 100. In FIG. 17, portions which are the same as those illustrated in the first embodiment are denoted by the same reference numerals as those used in the first embodiment, and are not described again below.

As illustrated in FIG. 17, in this embodiment, the partitioning plate 53 (see FIG. 5) in the first embodiment is not provided, but instead, the top panel 50 is extended from above the cold aisle 39 to the front surface 21y of the container 21.

Since the top panel 50 is formed to match the inner shape of the container 21, the exhaust airflow E flowing above the top panel 50 does not leak to the upstream side of the fan unit 38 from the outer edge of the top panel 50.

The top panel 50 is provided with the second opening-closing portion 52 described in the first embodiment.

Like the first embodiment, the module-type data center 100 may also operate in the following first to fourth operation modes.

FIG. 18A, FIG. 19A, FIG. 20A, and FIG. 21A are each a psychrometric chart depicting the position of the status point P for a corresponding one of the first to fourth operation modes.

FIG. 18B, FIG. 19B, FIG. 20B, and FIG. 21B are each a cross-sectional view of the module-type data center 100 in a corresponding one of the first to fourth operation modes.

(First Operation Mode)

Figure 18A:
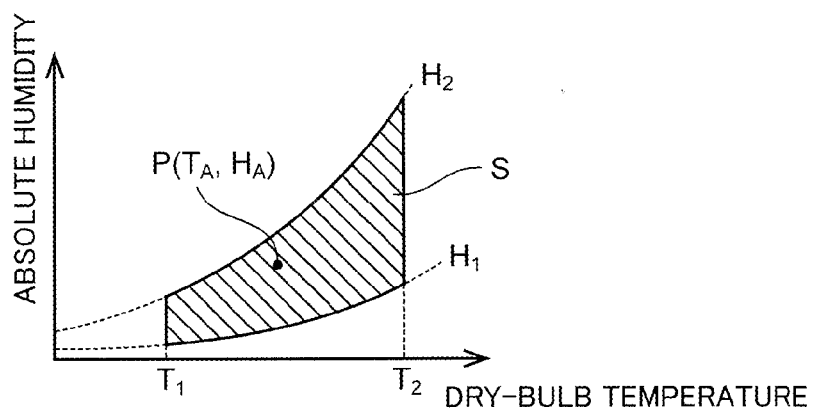
FIG. 18A is a psychrometric chart depicting the position of a status point for a first operation mode of the module-type data center according to the second embodiment.

As illustrated in FIG. 18A, in the first operation mode, the outside air A does not have to be adjusted because the status point P of the outside air A is inside the operation-guaranteed range S.

Figure 18B:
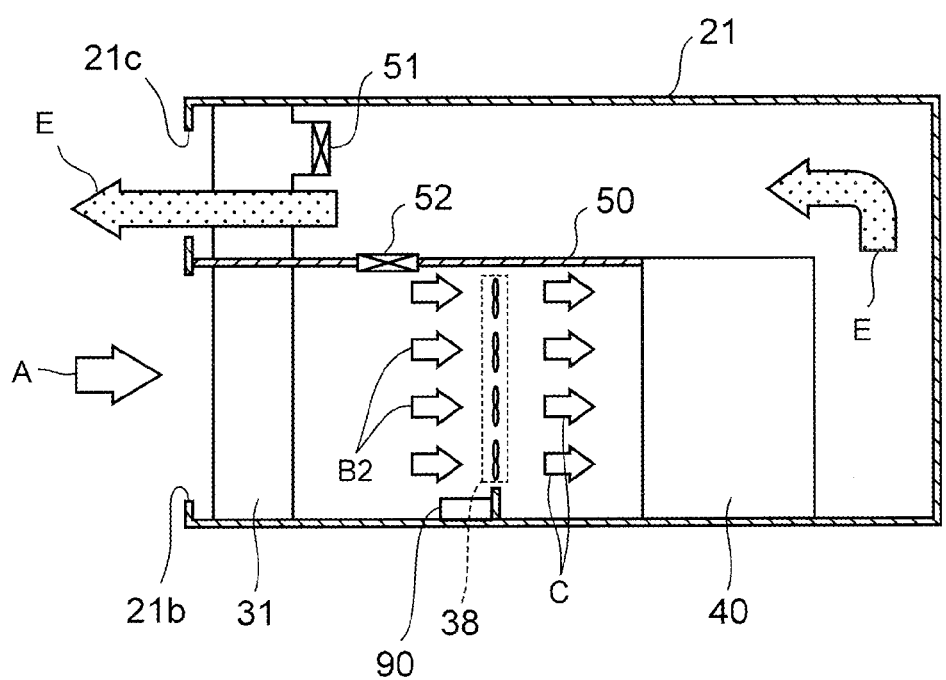
FIG. 18B is a cross-sectional view of the module-type data center according to the second embodiment in the first operation mode.

In this case, under the control of the controller 90, the fans 36 (see FIG. 5) of the air conditioner 31 are stopped, and the electromagnetic valve 35 (see FIG. 6) is closed to stop the water W from dropping to the elements 34, as illustrated in FIG. 18B.

In addition, to prevent the mixed airflow C from increasing in temperature by being mixed with the exhaust airflow E, the first and second opening-closing portions 51 and 52 are closed under the control of the controller 90.

Like the first embodiment, stopping the fans 36 in this mode enables energy-saving. Moreover, since the flow of the outside air A through the first intake openings 21a (see FIG. 17) is stopped, clogging of the filter 27 (see FIG. 4) is suppressed.

(Second Operation Mode)

Figure 19A:
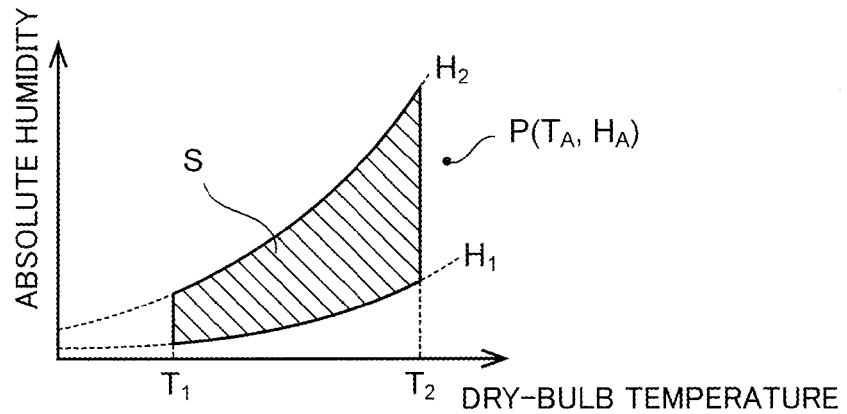
FIG. 19A is a psychrometric chart depicting the position of the status point for a second operation mode of the module-type data center according to the second embodiment.

As illustrated in FIG. 19A, in the second operation mode, the status point P of the outside air A is rightward of the operation-guaranteed range S.

Figure 19B:
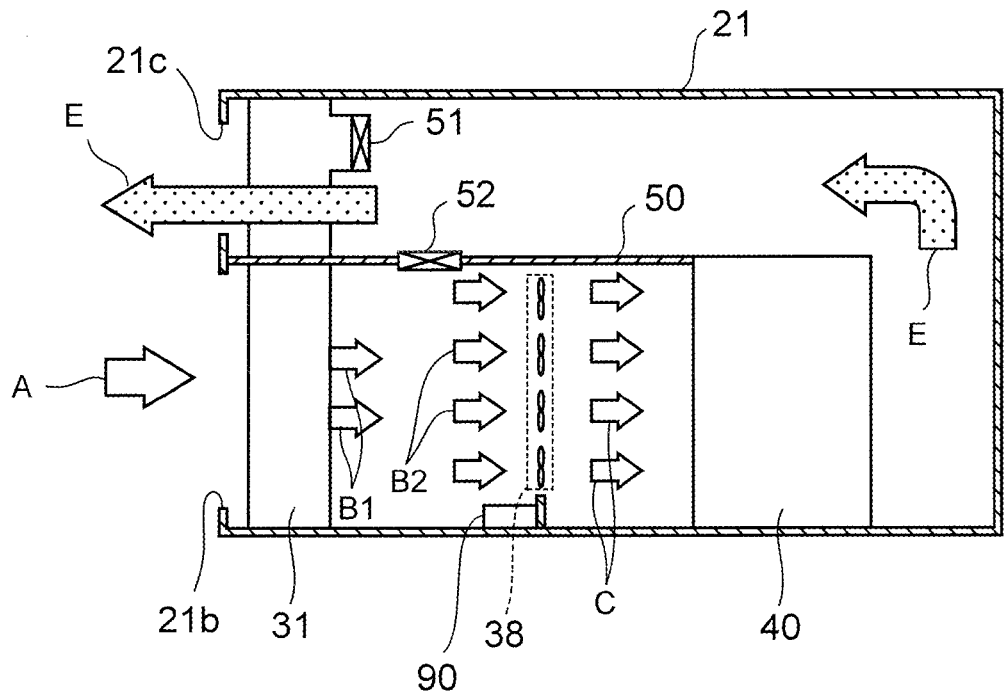
FIG. 19B is a cross-sectional view of the module-type data center according to the second embodiment in the second operation mode.

In this case, to cool the outside air A, under the control of the controller 90, the fans 36 (see FIG. 5) of the air conditioners 31 are driven, and the electromagnetic valve 35 (see FIG. 6) is opened to drop the water W to the elements 34, as illustrated in FIG. 19B.

Thereby, the first airflows B1 cooled by the air conditioners 31 decrease the temperature of the mixed airflow C, so that the status point P of the mixed airflow C may fall within the operation-guaranteed range S.

Also in this mode, the first and second opening-closing portions 51 and 52 are closed under the control of the controller 90 so that the mixed airflow C does not increase in temperature by being mixed with the exhaust airflow E.

(Third Operation Mode)

Figure 20A:
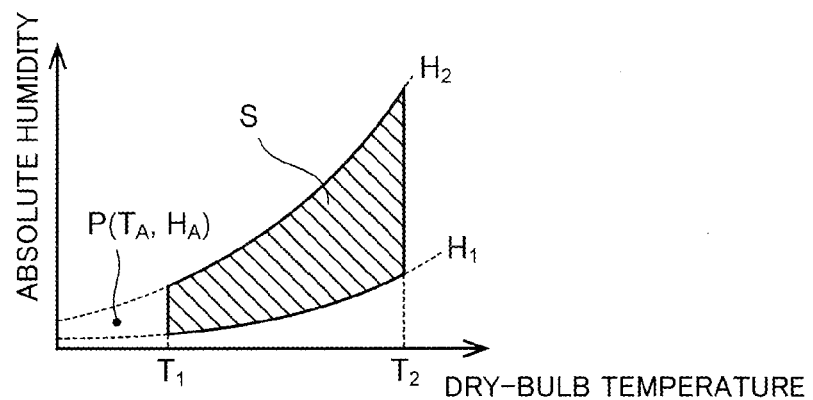
FIG. 20A is a psychrometric chart depicting the position of the status point for a third operation mode of the module-type data center according to the second embodiment.

As illustrated in FIG. 20A, in the third operation mode, the status point P of the outside air A is leftward of the operation-guaranteed range S.

Figure 20B:
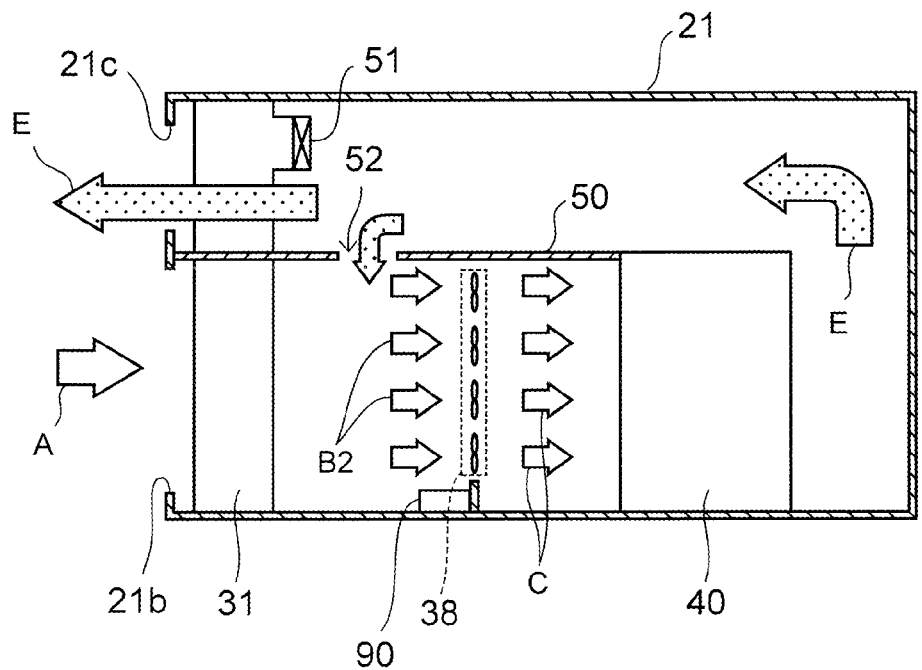
FIG. 20B is a cross-sectional view of the module-type data center according to the second embodiment in the third operation mode.

In this case, as illustrated in FIG. 20B, the air conditioners 31 is stopped operating to stop generation of the first airflows B1. In addition, under the control of the controller 90, the second opening-closing portion 52 is opened to warm up the mixed airflow C with the exhaust airflow E.

Thereby, the temperature of the mixed airflow C increases, which consequently allows the status point P of the mixed airflow C to fall within the operation-guaranteed range S.

(Fourth Operation Mode)

Figure 21A:
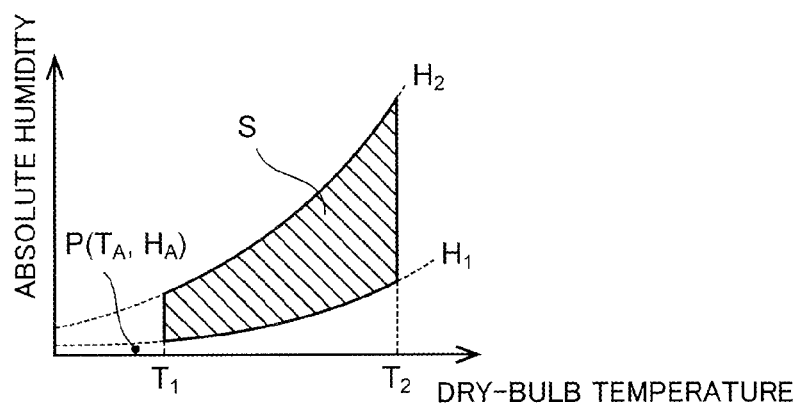
FIG. 21A is a psychrometric chart depicting the position of the status point for a fourth operation mode of the module-type data center according to the second embodiment.

As illustrated in FIG. 21A, in the fourth operation mode, the status point P of the outside air A is located outside the operation-guaranteed range S at the bottom left thereof.

Figure 21B:
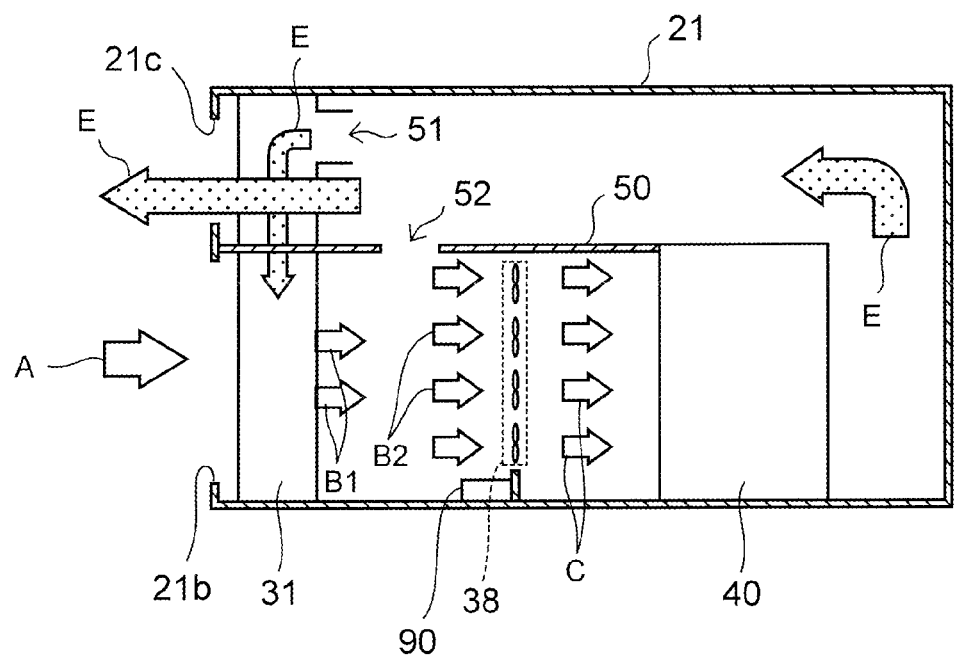
FIG. 21B is a cross-sectional view of the module-type data center according to the second embodiment in the fourth operation mode.

In this case, as illustrated in FIG. 21B, under the control of the controller 90, the first and second opening-closing portions 51 and 52 are both opened to warm up the mixed airflow C with the exhaust airflow E. In addition, the air conditioners 31 are driven to humidify the mixed airflow C.

The status point P of the mixed airflow C may thereby fall within the operation-guaranteed range S.

All examples and conditional language recited herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A module-type data center comprising:
   a casing including a first intake opening, a second intake opening, and an exhaust opening;
   an air conditioner provided in the casing and configured to generate a first airflow by taking in outside air through the first intake opening and bringing the outside air into direct contact with a refrigerant;
   a fan unit provided in the casing and configured to generate a second airflow by taking in outside air through the second intake opening; and
   an electronic device provided in the casing, and configured to be exposed to a mixed airflow of the first airflow and the second airflow and release an exhaust airflow containing the mixed airflow to the exhaust opening, wherein
   the first intake opening and the second intake opening are provided on different surfaces of the casing.

2. The module-type data center according to claim 1, wherein
   the air conditioner includes a fan operating independently from the fan unit, and
   the fan generates the first airflow.

3. The module-type data center according to claim 2, wherein
   the fan of the air conditioner is stopped when the outside air has a temperature within a temperature range in which operation of the electronic device is guaranteed.

4. The module-type data center according to claim 2, wherein
   the fan of the air conditioner is stopped when the outside air has a humidity within a humidity range in which operation of the electronic device is guaranteed.

5. The module-type data center according to claim 2, wherein
   the fan of the air conditioner is operated when the outside air has a temperature exceeding a temperature at which operation of the electronic device is guaranteed.

6. The module-type data center according to claim 5, the data center further comprising:
   a controller configured to control a rotation speed of the fan so that a humidity of the mixed airflow becomes a target humidity.

7. The module-type data center according to claim 1, wherein
   the air conditioner includes
   an element impregnated with the refrigerant and exposed to the outside air, and
   a valve configured to supply the refrigerant to the element, and
   the valve is closed when the outside air has a humidity exceeding a prescribed value.

8. The module-type data center according to claim 1, the data center further comprising:
   a first flow channel which communicates with the first intake opening and through which the exhaust airflow flows to the first intake opening; and
   a first opening-closing portion provided in the first flow channel and configured to open or close the first flow channel.

9. The module-type data center according to claim 8, wherein
   the first flow channel is a duct, and
   the first opening-closing portion is a first damper.

10. The module-type data center according to claim 8, the data center further comprising:
    a second flow channel separated from the first flow channel and configured to lead the exhaust airflow to an upstream of the fan unit; and
    a second opening-closing portion provided in the second flow channel and configured to open or close the second flow channel.

11. The module-type data center according to claim 10, wherein
    the second opening-closing portion adjusts a flow rate of the exhaust airflow flowing through the second flow channel continuously or in stepwise manner.

12. The module-type data center according to claim 10, wherein
    the second opening-closing portion is a second damper.

13. The module-type data center according to claim 10, wherein
    the first opening-closing portion and the second opening-closing portion are closed when the outside air has a temperature within a temperature range in which operation of the electronic device is guaranteed.

14. The module-type data center according to claim 10, wherein
    the second opening-closing portion is opened when the outside air has a temperature below a temperature at which operation of the electronic device is guaranteed.

15. The module-type data center according to claim 14, the data center further comprising:
    a controller configured to control an opening degree of the second opening-closing portion so that a temperature of the mixed airflow becomes a target temperature.

16. The module-type data center according to claim 8, wherein
    the first opening-closing portion is opened when the outside air has a temperature below a temperature at which operation of the electronic device is guaranteed, and when the outside air has a humidity below a humidity at which operation of the electronic device is guaranteed.

17. The module-type data center according to claim 1, wherein
    an outer shape of the casing is a cuboid,
    the first intake opening is provided on a side surface of the cuboid, and
    the second intake opening is provided on a front surface of the cuboid.

18. The module-type data center according to claim 17, wherein
the exhaust opening is provided on the front surface of the cuboid.

19. The module-type data center according to claim 1, wherein
at least one of the first intake opening and the second intake opening is provided with a filter.

20. A method of controlling a module-type data center, the method comprising:
generating a first airflow by taking in outside air through a first intake opening provided on a casing and bringing the outside air into direct contact with a refrigerant;
generating a second airflow by taking in outside air through a second intake opening provided on a surface of the casing different from a surface having the first intake opening; and
exposing an electronic device provided in the casing to a mixed airflow of the first airflow and the second airflow.

* * * * *